US011908665B2

(12) United States Patent
Koshimizu et al.

(10) Patent No.: US 11,908,665 B2
(45) Date of Patent: Feb. 20, 2024

(54) PLASMA PROCESSING APPARATUS AND MEASUREMENT METHOD

(71) Applicant: Tokyo Electron Limited, Tokyo (JP)

(72) Inventors: Chishio Koshimizu, Miyagi (JP); Manabu Iwata, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 266 days.

(21) Appl. No.: 16/953,808

(22) Filed: Nov. 20, 2020

(65) Prior Publication Data

US 2021/0166920 A1 Jun. 3, 2021

(30) Foreign Application Priority Data

Nov. 28, 2019 (JP) ................. 2019-215428

(51) Int. Cl.
*H01J 37/32* (2006.01)
*H01L 21/67* (2006.01)
*H05H 1/46* (2006.01)
*H01L 21/683* (2006.01)

(52) U.S. Cl.
CPC .. *H01J 37/32642* (2013.01); *H01J 37/32091* (2013.01); *H01J 37/32715* (2013.01); *H01L 21/6833* (2013.01); *H05H 1/46* (2013.01); *H01J 2237/24564* (2013.01); *H01J 2237/24585* (2013.01)

(58) Field of Classification Search
CPC ........... H01J 37/32642; H01J 37/32697; H01J 37/32522; H01J 37/32541; H01J 37/32715; H01J 37/32935; H01J 37/32091; H01J 2237/24564; H01J 37/32724; H01J 37/32174; H01J 2237/24585; H01H 2237/24585; H01L 21/683; H01L 21/67069; H01L 21/67253; H01L 21/6831; H01L 21/6833; H01L 21/67309; H01L 21/67248
See application file for complete search history.

(56) References Cited

U.S. PATENT DOCUMENTS

| | | | | |
|---|---|---|---|---|
| 2009/0242127 | A1* | 10/2009 | Koshimizu | ....... H01J 37/32697 156/345.47 |
| 2010/0000970 | A1* | 1/2010 | Koshimizu | ....... H01J 37/32642 156/345.48 |
| 2010/0025369 | A1* | 2/2010 | Negishi | ............. H01J 37/32935 216/60 |

(Continued)

FOREIGN PATENT DOCUMENTS

| | | |
|---|---|---|
| JP | 2001-118700 A | 4/2001 |
| JP | 2007-258417 A | 10/2007 |

(Continued)

*Primary Examiner* — Haissa Philogene
(74) *Attorney, Agent, or Firm* — Studebaker & Brackett PC

(57) ABSTRACT

A disclosed plasma processing apparatus includes a chamber, a substrate support, an electric path, and a measuring device. The substrate support is accommodated in the chamber. The electric path is coupled to or capacitively coupled to an edge ring on the substrate support. The measuring device measures an electrical characteristic value of the edge ring with a voltage applied to the edge ring on the substrate support through the electric path. The electrical characteristic value measured by the measuring device is variable in accordance with a thickness of the edge ring.

19 Claims, 17 Drawing Sheets

(56) References Cited

U.S. PATENT DOCUMENTS

| | | | |
|---|---|---|---|
| 2018/0366305 A1* | 12/2018 | Nagami | H01J 37/32091 |
| 2020/0111648 A1* | 4/2020 | Ogata | H01L 21/68735 |
| 2020/0152428 A1* | 5/2020 | Sasaki | H01J 37/32715 |
| 2020/0176228 A1* | 6/2020 | Oka | H01L 21/67103 |
| 2021/0111067 A1* | 4/2021 | Jiang | H01L 21/76862 |

FOREIGN PATENT DOCUMENTS

| | | |
|---|---|---|
| JP | 2018-032857 A | 3/2018 |
| JP | 2018-206989 A | 12/2018 |

\* cited by examiner

PLASMA PROCESSING APPARATUS AND MEASUREMENT METHOD

CROSS-REFERENCE TO RELATED APPLICATIONS

This application claims priority to Japanese Patent Application No. 2019-215428 filed on Nov. 28, 2019, the entire disclosure of which is incorporated herein by reference.

FIELD

Exemplary embodiments of the present disclosure relate to a plasma processing apparatus and a measurement method.

BACKGROUND

A plasma processing apparatus is used to perform plasma processing on a substrate. In a chamber in the plasma processing apparatus, the substrate is placed in an area surrounded by an edge ring. The edge ring may also be called a focus ring.

The edge ring can wear and become thinner through plasma processing performed in the plasma processing apparatus. As the edge ring has a smaller thickness, a sheath that forms above the edge ring can have an upper end at a lower position. With the sheath above the edge ring having the upper end at a lower position, ions in the plasma can diagonally strike the edge of the substrate, thus causing tilting of recesses in the edge of the substrate. To reduce such tilting of recesses in the edge of the substrate, a direct-current (DC) voltage is applied to the edge ring as described in Japanese Unexamined Patent Application Publication No. 2007-258417.

SUMMARY

A plasma processing apparatus according to an exemplary embodiment includes a chamber, a substrate support, an electric path, and a measuring device. The substrate support is accommodated in the chamber. The electric path is coupled to or capacitively coupled to an edge ring on the substrate support. The measuring device measures an electrical characteristic value of the edge ring with a voltage applied to the edge ring on the substrate support through the electric path. The electrical characteristic value measured by the measuring device is variable in accordance with a thickness of the edge ring.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
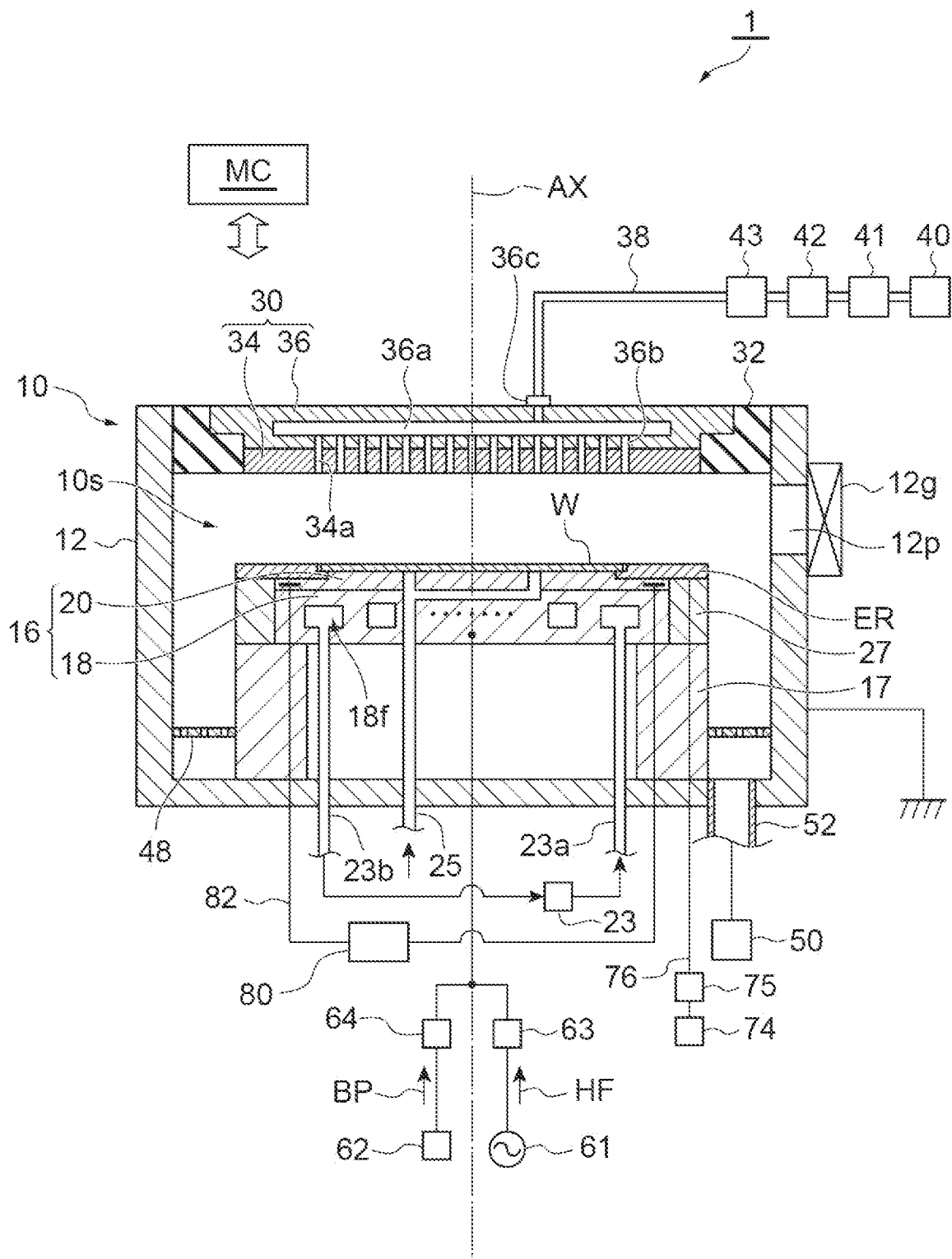
FIG. 1 is a schematic diagram of a plasma processing apparatus according to an exemplary embodiment.

Exemplary embodiments will now be described.

A plasma processing apparatus according to one exemplary embodiment includes a chamber, a substrate support, an electric path, and a measuring device. The substrate support is accommodated in the chamber. The electric path is coupled to or capacitively coupled to an edge ring on the substrate support. The measuring device measures an electrical characteristic value of the edge ring with a voltage applied to the edge ring on the substrate support through the electric path. The electrical characteristic value measured by the measuring device is variable in accordance with a thickness of the edge ring.

When the edge ring is on the substrate support, the electric path to be coupled to or to be capacitively coupled to the edge ring forms in the above embodiment. The measuring device applies a voltage to the edge ring through the electric path to measure an electrical characteristic value of the edge ring that varies depending on the thickness of the edge ring. Thus, the technique according to the above embodiment enables determination of a value reflecting the thickness of an edge ring.

In one exemplary embodiment, the plasma processing apparatus may further include a temperature controller that controls a temperature of the edge ring. In this embodiment, the measuring device may obtain the electrical characteristic value of the edge ring with the temperature being controlled at a reference temperature by the temperature controller.

In one exemplary embodiment, the plasma processing apparatus may further include a temperature sensor that obtains a temperature measurement value of the edge ring.

In this embodiment, the electrical characteristic value may include an electrical characteristic value of the edge ring at a reference temperature. In this embodiment, the measuring device may convert an electrical characteristic value of the edge ring at the temperature measurement value obtained by the temperature sensor to an electrical characteristic value of the edge ring at the reference temperature.

In one exemplary embodiment, the measuring device may measure the electrical characteristic value with an alternating-current voltage or a radio-frequency voltage applied to the edge ring through the electric path capacitively coupled to the edge ring.

In one exemplary embodiment, the electrical characteristic value may include a value of a real part of an impedance of the edge ring.

In one exemplary embodiment, the substrate support may include a dielectric portion on which a part of the edge ring is placeable. In this embodiment, the electric path may include a first electrode and a second electrode located in the dielectric portion. In this embodiment, the measuring device may apply the alternating-current voltage or the radio-frequency voltage to the edge ring through the first electrode and the second electrode capacitively coupled to the edge ring.

In one exemplary embodiment, the substrate support may further include a lower electrode and an electrostatic chuck. The electrostatic chuck may be located on the lower electrode. In this embodiment, the dielectric portion may extend between the lower electrode and the electrostatic chuck and a side wall of the chamber to surround the lower electrode and the electrostatic chuck.

In one exemplary embodiment, the substrate support may include an electrostatic chuck. The dielectric portion may include a part of the electrostatic chuck.

In one exemplary embodiment, the first electrode and the second electrode may be electrically coupled to one or more direct-current power supplies to generate an electrostatic attraction between the electrostatic chuck and the edge ring. In other words, in this embodiment, the two electrodes used to generate the electrostatic attraction between the electrostatic chuck and the edge ring are also used to apply a voltage to the edge ring to determine the electrical characteristic value of the edge ring.

In one exemplary embodiment, the measuring device may measure the electrical characteristic value with a direct-current voltage applied to the edge ring through the electric path coupled to the edge ring.

In one exemplary embodiment, the electrical characteristic value may include a resistance of the edge ring.

In one exemplary embodiment, the electric path may include a first contact and a second contact in contact with the edge ring at positions symmetric to each other about a central axis of the edge ring.

In one exemplary embodiment, the measuring device may include a current sensor and a voltage sensor. In this embodiment, the current sensor may be located on the electric path to measure a current value of a current flowing through the edge ring. In this embodiment, the voltage sensor may measure a potential difference across the edge ring between the first contact and the second contact. In this embodiment, the measuring device may determine the resistance based on the potential difference and the current value.

In one exemplary embodiment, the measuring device may include a current sensor, a first voltage sensor, and a second voltage sensor. In this embodiment, the current sensor may be located on the electric path to measure a current value of a current flowing through the edge ring. In this embodiment, the first voltage sensor may measure a first potential difference across a first area of the edge ring extending in a first part of a plane including the first contact, the second contact, and the central axis. In this embodiment, the second voltage sensor may measure a second potential difference across a second area of the edge ring extending in a second part of the plane. In this embodiment, the measuring device may determine the resistance based on an average of the first potential difference and the second potential difference and on the current value.

In one exemplary embodiment, the measuring device may determine a thickness of the edge ring or a decrease in the thickness of the edge ring based on the electrical characteristic value.

In one exemplary embodiment, the plasma processing apparatus may further include an adjuster and a controller. In this embodiment, the adjuster may adjust an upper end position of a sheath above the edge ring. The controller may control the adjuster to reduce tilting of a recess in an edge of a substrate on the substrate support in accordance with the electrical characteristic value, or a thickness of the edge ring determined based on the electrical characteristic value or a decrease in the thickness of the edge ring determined based on the electrical characteristic value.

In one exemplary embodiment, the adjuster may be controlled by the controller to adjust a vertical position of an upper surface of the edge ring or a potential of the edge ring. The vertical position of the upper surface of the edge ring or the potential of the edge ring may be adjusted in accordance with the electrical characteristic value, or the thickness of the edge ring determined based on the electrical characteristic value or the decrease in the thickness of the edge ring determined based on the electrical characteristic value.

In one exemplary embodiment, the adjuster may include a power supply electrically coupled to the edge ring to set a potential of the edge ring. In this embodiment, the electric path may include a first switch and a second switch that selectively couple the edge ring to the power supply or to the measuring device.

A measurement method according to one exemplary embodiment includes applying a voltage to an edge ring on a substrate support in a chamber in a plasma processing apparatus. The method further includes measuring an electrical characteristic value of the edge ring variable in accordance with a thickness of the edge ring with the voltage applied to the edge ring.

Exemplary embodiments will now be described in detail with reference to the drawings. in the drawings, similar or corresponding components are indicated by like reference numerals. The embodiments are illustrated by way of example and not by way of limitation in the accompanying drawings that are not to scale unless otherwise indicated.

FIG. 1 is a schematic diagram of a plasma processing apparatus according to an exemplary embodiment. A plasma processing apparatus 1 shown in FIG. 1 is a capacitively coupled plasma processing apparatus. The plasma processing apparatus 1 includes a chamber 10 having an internal space 10s with a central axis AX in the vertical direction.

In one embodiment, the chamber 10 includes a chamber body 12, which is substantially cylindrical and has the internal space 10s. The chamber body 12 is formed from, for example, aluminum, and is electrically grounded. The chamber body 12 has an inner wall defining the internal space 10s, coated with a plasma-resistant film. The film may be a ceramic film, such as an anodized film or a film formed from yttrium oxide.

The chamber body 12 has a side wall having a port 12p. A substrate W is transferred between the internal space 10s and the outside of the chamber 10 through the port 12p. A gate valve 12g is on the side wall of the chamber body 12 to open and close the port 12p.

The plasma processing apparatus 1 further includes a substrate support 16. The substrate support 16 supports the substrate W on the substrate support 16 in the chamber 10. The substrate W is substantially disk-shaped. The substrate support 16 is supported by a support 17. The support 17 extends upward from the bottom of the chamber body 12. The support 17 is substantially cylindrical and is formed from an insulating material such as quartz.

The substrate support 16 includes a lower electrode 18 and an electrostatic chuck (ESC) 20. The lower electrode 18 and the ESC 20 are accommodated in the chamber 10. The lower electrode 18 is substantially disk-shaped and is formed from a conductive material such as aluminum.

The lower electrode 18 has an internal channel 18f for carrying a heat-exchange medium. Examples of the heat-exchange medium include a liquid refrigerant and a refrigerant to be vaporized (e.g., chlorofluorocarbon) to cool the lower electrode 18. The channel 18f is connected to a supply unit 23 (e.g., chiller unit) for supplying the heat-exchange medium. The supply unit 23 is external to the chamber 10. The heat-exchange medium is supplied from the supply unit 23 to the channel 18f through a pipe 23a, and then returns to the supply unit 23 through a pipe 23b. The temperature of the substrate W on the substrate support 16 is adjusted through the heat-exchange medium circulating through the supply unit 23 and the channel 18f.

Figure 2:
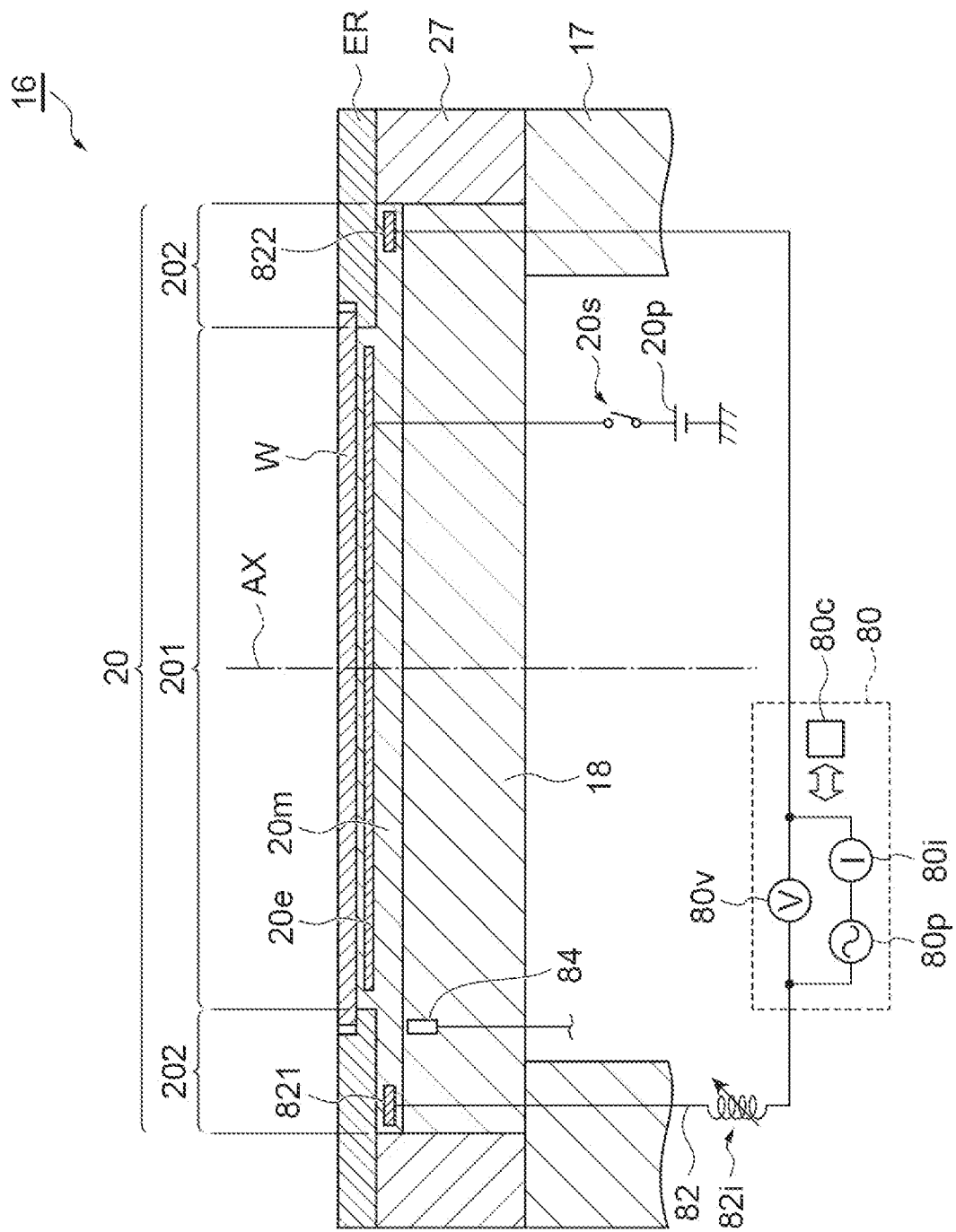
FIG. 2 is a diagram of a substrate support, an electric path, and a measuring device according to the exemplary embodiment.

FIG. 2 is a diagram of the substrate support, an electric path, and a measuring device according to the exemplary embodiment. As shown in FIGS. 1 and 2, the ESC 20 is on the lower electrode 18. The substrate W is placed onto and held by the ESC 20 for processing in the internal space 10s.

The ESC 20 includes a body 20m and an electrode 20e. The body 20m is substantially disk-shaped and is formed from a dielectric such as aluminum oxide or aluminum nitride. The ESC 20 has the axis AX as its central axis. The electrode 20e is located in the body 20m. The electrode 20e may be a conductive film. The electrode 20e is electrically coupled to a direct-current (DC) power supply 20p via a switch 20s. A voltage is applied from the DC power supply 20p to the electrode 20e to generate an electrostatic attraction between the ESC 20 and the substrate W. The electrostatic attraction causes the ESC 20 to attract and hold the substrate W.

In one embodiment, the ESC 20 may include a first portion 201 and a second portion 202. The first portion 201 can hold the substrate W placed on the first portion 201. The first portion 201 is substantially disk-shaped and has the axis AX as its central axis. The substrate W is placed onto the upper surface of the first portion 201 for processing in the chamber 10. The electrode 20e is located in the first portion 201 and in the body 20m.

The second portion 202 extends circumferentially about the central axis of the ESC 20, or about the axis AX, to surround the first portion 201. An edge ring ER is placed on the upper surface of the second portion 202. The edge ring ER is substantially annular and is placed on the second portion 202 with its central axis aligned with the axis AX. The substrate W is placed in an area on the first portion 201 surrounded by the edge ring ER. The edge ring ER is formed from, for example, a conductor or a semiconductor such as silicon or silicon carbide, or a dielectric such as quartz. The second portion 202 may be an ESC holding the edge ring ER. For example, the second portion 202 may incorporate a bipolar electrode in the body 20m as described later with reference to FIG. 6.

As shown in FIG. 1, the plasma processing apparatus 1 may further include a gas supply line 25. The gas supply line 25 supplies a heat-transfer gas (e.g., He gas) from a gas supply assembly into a space between an upper surface of the ESC 20 and a back surface (lower surface) of the substrate W.

The plasma processing apparatus 1 may further include an insulating portion 27. The insulating portion 27 is formed from a dielectric such as quartz. The insulating portion 27 extends between a side wall of the chamber 10 and both the lower electrode 18 and the ESC 20 to surround the lower electrode 18 and the ESC 20. The insulating portion 27 extends circumferentially along the outer peripheral surfaces of the lower electrode 18 and the second portion 202 of the ESC 20. The insulating portion 27 may be on the support 17. The edge ring ER is placed on the insulating portion 27 and on the second portion 202. In other words, a part of the edge ring ER may be placed on the insulating portion 27.

The plasma processing apparatus 1 further includes an upper electrode 30. The upper electrode 30 is above the substrate support 16. The upper electrode 30 closes a top opening of the chamber body 12 together with an insulating member 32. The upper electrode 30 is supported on an upper portion of the chamber body 12 with the member 32.

The upper electrode 30 includes a ceiling plate 34 and a support member 36. The ceiling plate 34 has its lower surface defining the internal space 10s. The ceiling plate 34 has multiple gas outlet holes 34a that are through-holes in the thickness direction (vertical direction). The ceiling plate 34 is formed from, but is not limited to, silicon. In some embodiments, the ceiling plate 34 may be an aluminum member coated with a plasma-resistant film. The film may be a ceramic film, such as an anodized film or a film formed from yttrium oxide. The plasma processing apparatus 1 may include a mechanism for changing the distance between the lower electrode 18 and the upper electrode 30. Changing the distance can control the density distribution of plasma.

The support member 36 supports the ceiling plate 34 in a detachable manner. The support member 36 is formed from a conductive material such as aluminum. The support member 36 has an internal gas-diffusion compartment 36a. Multiple gas holes 36b extend downward from the gas-diffusion compartment 36a. The gas holes 36b communicate with the respective gas outlet holes 34a. The support member 36 has a gas inlet 36c that connects to the gas-diffusion compartment 36a and to a gas supply pipe 38.

The gas supply pipe 38 is connected to a set of gas sources 40 via a set of valves 41, a set of flow controllers 42, and a set of valves 43. The valve set 41, the flow controller set 42, and the valve set 43 form a gas supply unit. The gas supply unit may further include the gas source set 40. The gas source set 40 includes multiple gas sources. The valve sets 41 and 43 each include multiple valves (e.g., open-close valves). The flow controller set 42 includes multiple flow controllers. The flow controllers in the flow controller set 42 are mass flow controllers or pressure-based flow controllers. The gas sources in the gas source set 40 are connected to the gas supply pipe 38 via the respective valves in the valve set 41, via, the respective flow controllers in the flow controller set 42, and via, the respective valves in the valve set 43. The plasma processing apparatus 1 can supply a gas from one or more gas sources selected from the multiple gas sources in the gas source set 40 into the internal space 10s at an individually controlled flow rate.

A baffle plate 48 is located between the substrate support 16 or the support 17 and the side wall of the chamber body 12. The baffle plate 48 may include, for example, an aluminum member covered with ceramic such as yttrium oxide. The baffle plate 48 has many through-holes. An exhaust pipe 52 is connected to the bottom of the chamber body 12 below the baffle plate 48. The exhaust pipe 52 is connected to an exhaust device 50. The exhaust device 50 includes a pressure controller such as an automatic pressure control valve and a vacuum pump such as a turbomolecular pump to reduce the pressure in the internal space 10s.

The plasma processing apparatus 1 further includes a radio-frequency (RF) power supply 61. The RF power supply 61 generates RF power HF. The RF power HF is used to generate plasma from a gas in the chamber 10. The RF power HF has a frequency ranging from 13 to 200 MHz, or for example, 40 or 60 MHz. The RF power supply 61 is coupled to the lower electrode 18 via a matching circuit 63. The matching circuit 63 has a variable impedance. The impedance of the matching circuit 63 is adjusted to reduce reflection from a load fir the RF power supply 61. For example, the matching circuit 63 adjusts the impedance of the load (lower electrode 18) for the RF power supply 61 to match to the output impedance of the RF power supply 61. The RF power supply 61 may not be electrically coupled to the lower electrode 18, and may be coupled to the upper electrode 30 via the matching circuit 63.

The plasma processing apparatus 1 further includes a bias power supply 62. The bias power supply 62 is electrically coupled to the lower electrode 18. The bias power supply 62 generates bias power BP, which is used to draw ions toward the substrate W The bias power BP is controlled to periodically change the potential of the substrate W on the ESC 20 in accordance with a second frequency lower than the first frequency.

In one embodiment, the bias power BP may be RE power with the second frequency. In this embodiment, the bias power BP has a frequency ranging from 50 kHz to 30 MHz inclusive, or may for example be 400 kHz. In this embodiment, the bias power supply 62 is coupled to the lower electrode 18 via a matching circuit 64. The matching circuit 64 has a variable impedance. The impedance of the matching circuit 64 is adjusted to reduce reflection from a load for the bias power supply 62. For example, the matching circuit 64 adjusts the impedance of the load (lower electrode 18) for the bias power supply 62 to match to the output impedance of the bias power supply 62.

In another embodiment, the bias power supply 62 may intermittently or periodically apply a pulsed negative DC voltage to the lower electrode 18 as the bias power BP. The pulsed DC voltage may be periodically applied to the lower electrode 18 in accordance with the second frequency. In this embodiment, the second frequency ranges from 50 kHz to 27 MHz inclusive, or may for example be 400 kHz. In this embodiment, the matching circuit 64 may be eliminated.

A gas is supplied into the internal space 10s for plasma processing, or for example, plasma etching, in the plasma processing apparatus 1. At least one of the RF power HF or the bias power BP is then provided to excite the gas in the internal space 10s. This generates plasma in the internal space 10s. The substrate W is processed with a chemical species of, for example, ions or radicals, contained in the generated plasma.

In one embodiment, the plasma processing apparatus 1 may further include an adjuster 74. The adjuster 74 adjusts an upper end position of a sheath above the edge ring ER. The adjuster 74 adjusts the upper end position of the sheath above the edge ring ER to eliminate or reduce a difference between the upper end position of the sheath above the edge ring ER and the upper end position of the sheath above the substrate W.

In one embodiment, the adjuster 74 is a power supply for applying a voltage to the edge ring ER to control the potential of the edge ring ER. The adjuster 74 may apply a negative voltage to the edge ring ER. The adjuster 74 may apply a DC voltage or an RF voltage to the edge ring ER. In some embodiments, the adjuster 74 may intermittently or periodically apply a pulsed DC voltage to the edge ring ER. In this embodiment, the adjuster 74 is coupled to the edge ring ER through a filter 75 and a conducting wire 76. The filter 75 cuts or reduces RF power entering the adjuster 74.

The plasma processing apparatus 1 further includes a measuring device 80 and an electric path 82. The electric path 82 is coupled to or capacitively coupled to the edge ring ER placed on the substrate support 16. The measuring device 80 applies a voltage to the edge ring ER placed on the substrate support 16 through the electric path 82 to measure an electrical characteristic value of the edge ring ER. The electrical characteristic value of the edge ring ER measured by the measuring device 80 varies depending on the thickness of the edge ring ER. The measuring device 80 and the electric path 82 according to embodiments will be described in detail later.

In one embodiment, the plasma processing apparatus 1 may further include a temperature sensor 84 as shown in FIG. 2. The temperature sensor 84 measures the temperature of the edge ring ER. In one example, the temperature sensor 84 may measure the internal temperature of the substrate support 16 as the temperature of the edge ring ER. In this example, the supply unit 23 may adjust at least one of the temperature or the flow rate of the heat-exchange medium in accordance with the temperature measured by the temperature sensor 84.

A controller MC is a computer including a processor, a storage, an input device, and a display, and controls the components of the plasma processing apparatus 1. The controller MC executes a control program stored in the storage to control the components of the plasma processing apparatus 1 in accordance with recipe data stored in the storage. in response to the control by the controller MC, a process specified by the recipe data is performed in the plasma processing apparatus 1. The components of the plasma processing apparatus 1 are controlled by the controller MC to allow the plasma processing apparatus 1 to implement a method according to an embodiment (described later).

Figure 3:
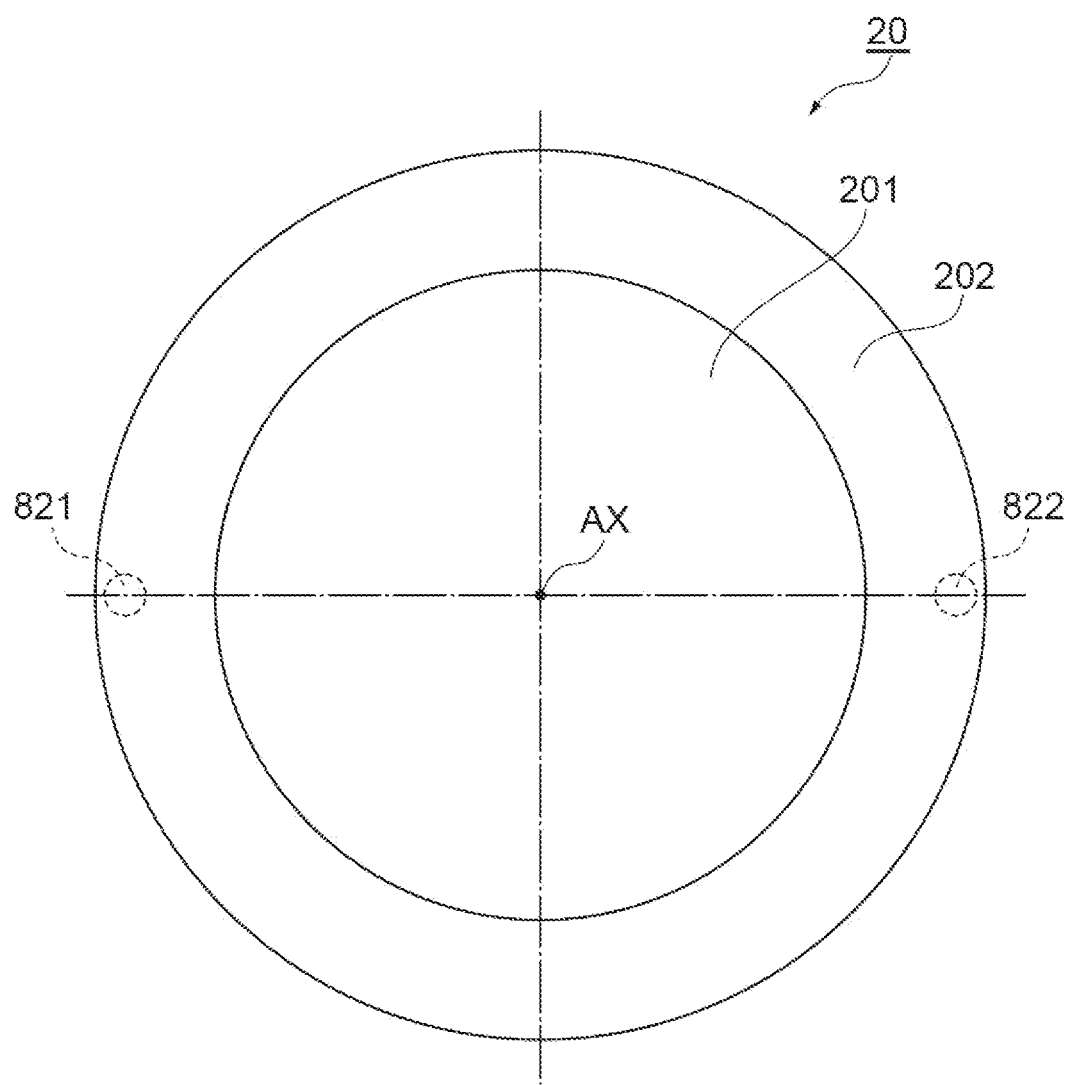
FIG. 3 is a plan view of a first electrode and a second electrode in an exemplary layout.

Referring now to FIG. 2, the electric path 82 is capacitively coupled to the edge ring ER in one embodiment. The electric path 82 shown in FIG. 2 includes a first electrode 821 and a second electrode 822. The first electrode 821 and the second electrode 822 are capacitively coupled to the edge ring ER placed on the substrate support 16. The first electrode 821 and the second electrode 822 are located in a dielectric portion on which a part of the edge ring ER is placed. FIG. 3 is a plan view of the first electrode and the second electrode in an exemplary layout. In the example shown in FIG. 3, the first electrode 821 and the second electrode 822 are located in the body 20m of the second portion 202. In the example shown in FIG. 3, the first electrode 821 and the second electrode 822 are symmetric to each other about the axis X. The first electrode 821 and the second electrode 822, which each extend circumstantially about the axis AX, are located apart from each other circumferentially. The first electrode 821 and the second electrode 822 may be substantially circular or island electrodes.

In one embodiment, the measuring device 80 determines a resistance $R_{ER}$ of the edge ring ER as the electrical characteristic value of the edge ring ER. As shown in FIG. 2, the measuring device 80 may include a power supply 80p, a voltage sensor 80v, and a current sensor 80i, The voltage sensor 80v is coupled to the power supply 80p and the current sensor 80i in parallel. The current sensor 80i is coupled to the power supply 80p in series. The measuring device 80 may further include an arithmetic unit 80c. The arithmetic unit 80c may include a processor and a memory.

The power supply 80p is an alternating-current (AC) power supply or an RE power supply. More specifically, the power supply 80p applies an AC voltage or an RE voltage to the edge ring ER through the electric path 82. When the circuit including the electric path 82 and the edge ring ER does not resonate, the electric path 82 may include an inductor 82i, The inductance of the inductor 82i is adjustable to cause resonance of the circuit including the electric path 82 and the edge ring ER. In some embodiments, the frequency of the RE power may be changed, and the impedance at the frequency may be measured to determine its real part.

The arithmetic unit 80c determines the real part of the impedance of the edge ring ER as the resistance $R_{ER}$ of the edge ring ER. The arithmetic unit 80c stores an impedance $Z_1$ of the edge ring ER not on the substrate support 16. The arithmetic unit 80c determines an impedance $Z_2$ of the edge ring ER on the substrate support 16. The arithmetic unit 80c can determine the impedance based on a voltage V measured by the voltage sensor 80v and a current I measured by the current sensor 80i with the formula V/I.

The arithmetic unit 80c can determine the resistance $R_{ER}$ of the edge ring ER, or in other words, the real part of the impedance of the edge ring ER by Formula 1 below:

$$R_{ER}=Re((Z_2 \times Z_1)/(Z_2-Z_1)) \quad (1)$$

where Re( ) is a function that returns the real part of the operational result in parentheses.

The controller MC may calculate the resistance $R_{ER}$ of the edge ring ER in place of the arithmetic unit 80c. In this case, the measuring device 80 includes the controller MC and may eliminate the arithmetic unit 80c.

In some embodiments, the measuring device 80 may include a network analyzer. In this case, the resistance $R_{ER}$ of the edge ring ER can be determined based on the impedance $Z_2$ measured by the network analyzer and the impedance $Z_1$ with Formula 1. The controller MC may perform the operation defined by Formula 1. In this case, the measuring device 80 includes the controller MC and may eliminate the power supply 80p, the voltage sensor 80v, the current sensor 80i, and the arithmetic unit 80c. The measuring device 80 may be an impedance meter or another meter with similar functions.

When the electrical characteristic value of the edge ring ER is highly dependent on temperature, the electrical characteristic value of the edge ring ER at a reference temperature may be used. When the electrical characteristic value of the edge ring ER is highly dependent on temperature, the measuring device 80 obtains an electrical characteristic value (e.g., resistance $R_{ER}$) of the edge ring ER with the temperature being controlled at the reference temperature by a temperature controller. The controller MC controls the temperature controller to reduce a difference between the temperature measured by the temperature sensor 84 and the reference temperature. In one embodiment, the temperature controller includes the supply unit 23.

In some embodiments, when the electrical characteristic value of the edge ring ER is highly dependent on temperature, the arithmetic unit 80c or the controller MC in the measuring device 80 may convert an electrical characteristic value of the edge ring ER at a temperature measurement value obtained by the temperature sensor 84. More specifically, the electrical characteristic value of the edge ring ER at the temperature measurement value obtained by the temperature sensor 84 is converted to the electrical characteristic value of the edge ring ER at the reference temperature using a function or a table. The function or table is predefined for converting the electrical characteristic value of the edge ring ER at the temperature measurement value obtained by the temperature sensor 84 to the electrical characteristic value of the edge ring ER at the reference temperature. For example, the arithmetic unit 80c or the controller MC in the measuring device 80 converts the operational result from Formula 1 to the resistance $R_{ER}$ of the edge ring ER at the reference temperature using the predefined function or table.

In one embodiment, the arithmetic unit 80c or the controller MC in the measuring device 80 may determine the thickness of the edge ring ER based on an electrical characteristic value (e.g., resistance $R_{ER}$) of the edge ring ER. The thickness of the edge ring ER can be determined by converting the electrical characteristic value of the edge ring ER to the thickness of the edge ring ER using a function or a table. The function or table is predefined for converting the electrical characteristic value of the edge ring ER to the thickness of the edge ring ER. In one embodiment, the arithmetic unit 80c or the controller MC in the measuring device 80 may determine a decrease in the thickness of the edge ring ER from the initial thickness.

In one embodiment, the controller MC controls the adjuster 74 to reduce tilting of recesses in the edge of the substrate W on the substrate support 16. The controller MC controls the adjuster 74 in accordance with the electrical characteristic value (e.g., resistance $R_{ER}$) of the edge ring ER, the thickness of the edge ring ER, or the decrease in the thickness of the edge ring ER. For example, the controller MC determines a potential to be set for the edge ring ER in accordance with the electrical characteristic value (e.g., resistance $R_{ER}$) of the edge ring ER, the thickness of the edge ring ER, or the decrease in the thickness of the edge ring ER using a function or a table. The function or table is predefined for determining the potential to be set for the edge ring ER corresponding to the electrical characteristic value (e.g., resistance $R_{ER}$) of the edge ring ER, the thickness of the edge ring ER, or the decrease in the thickness of the edge ring ER. The controller MC controls the adjuster 74 to apply a voltage for setting the determined potential in the edge ring ER to the edge ring ER. In some embodiments, the density distribution of plasma may be controlled in accordance with the electrical characteristic value (e.g., resistance $R_{ER}$) of the edge ring ER, the thickness of the edge ring ER, or the decrease in the thickness of the edge ring ER. The density distribution of plasma may be controlled by adjusting the distance between the upper electrode and the lower electrode in the plasma processing apparatus.

Figure 4:
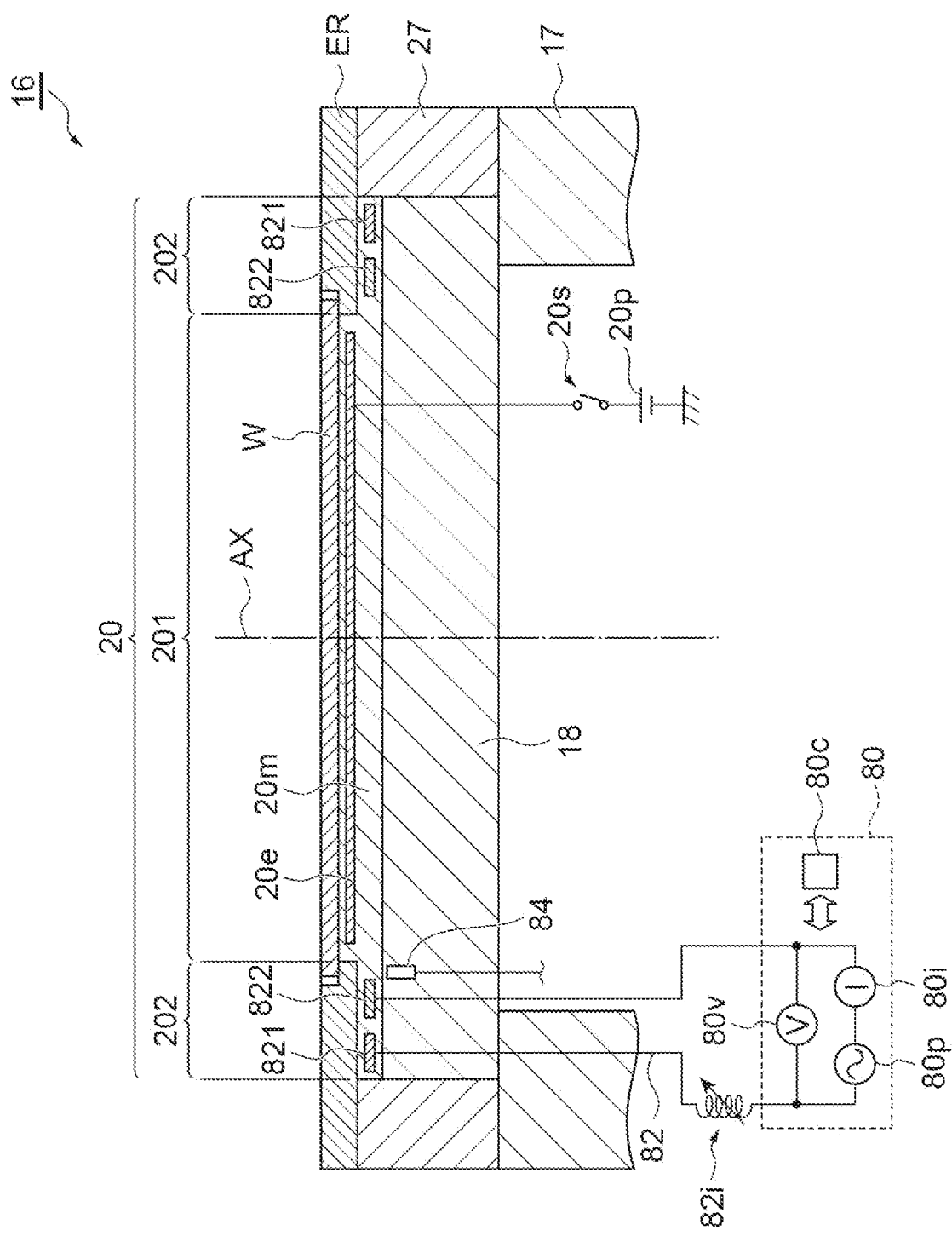
FIG. 4 is a diagram of an electric path including a first electrode and a second electrode according to another embodiment.
Figure 5:
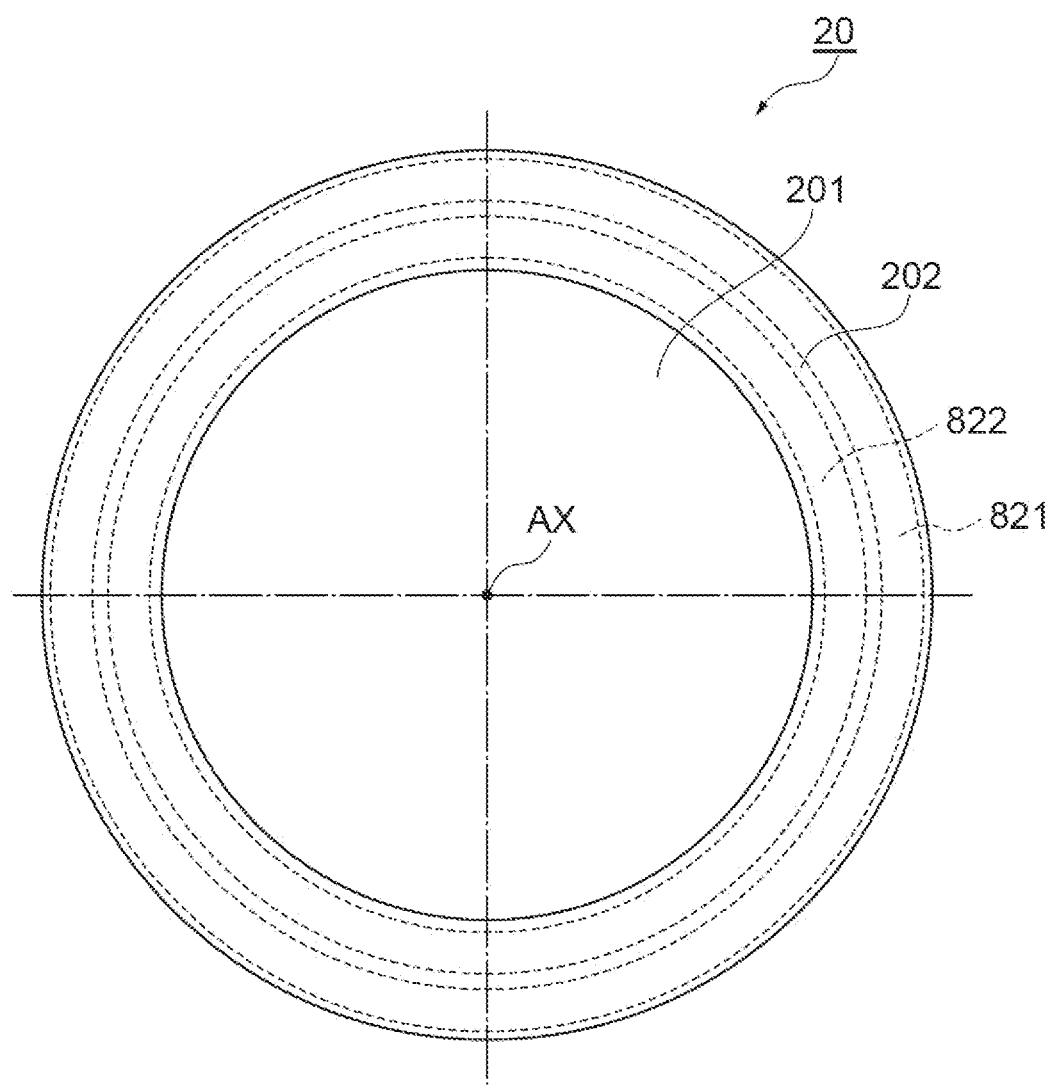
FIG. 5 is a plan view of the first electrode and the second electrode in another exemplary layout.

A first electrode and a second electrode according to another embodiment will now be described. FIG. 4 is a diagram of an electric path including the first electrode and the second electrode according to the other embodiment. FIG. 5 is a plan view of the first electrode and the second electrode in another exemplary layout. The plasma processing apparatus 1 may include an electric path 82 including a first electrode 821 and a second electrode 822 shown in FIGS. 4 and 5. As shown in FIGS. 4 and 5, the first electrode 821 and the second electrode 822 may be substantially annular and extend circumferentially about the axis AX. In the illustrated example, the first electrode 821 extends outside the second electrode 822. The first electrode 821 and the second electrode 822 are located in the second portion 202 and the body 20m of the ESC 20.

Figure 6:
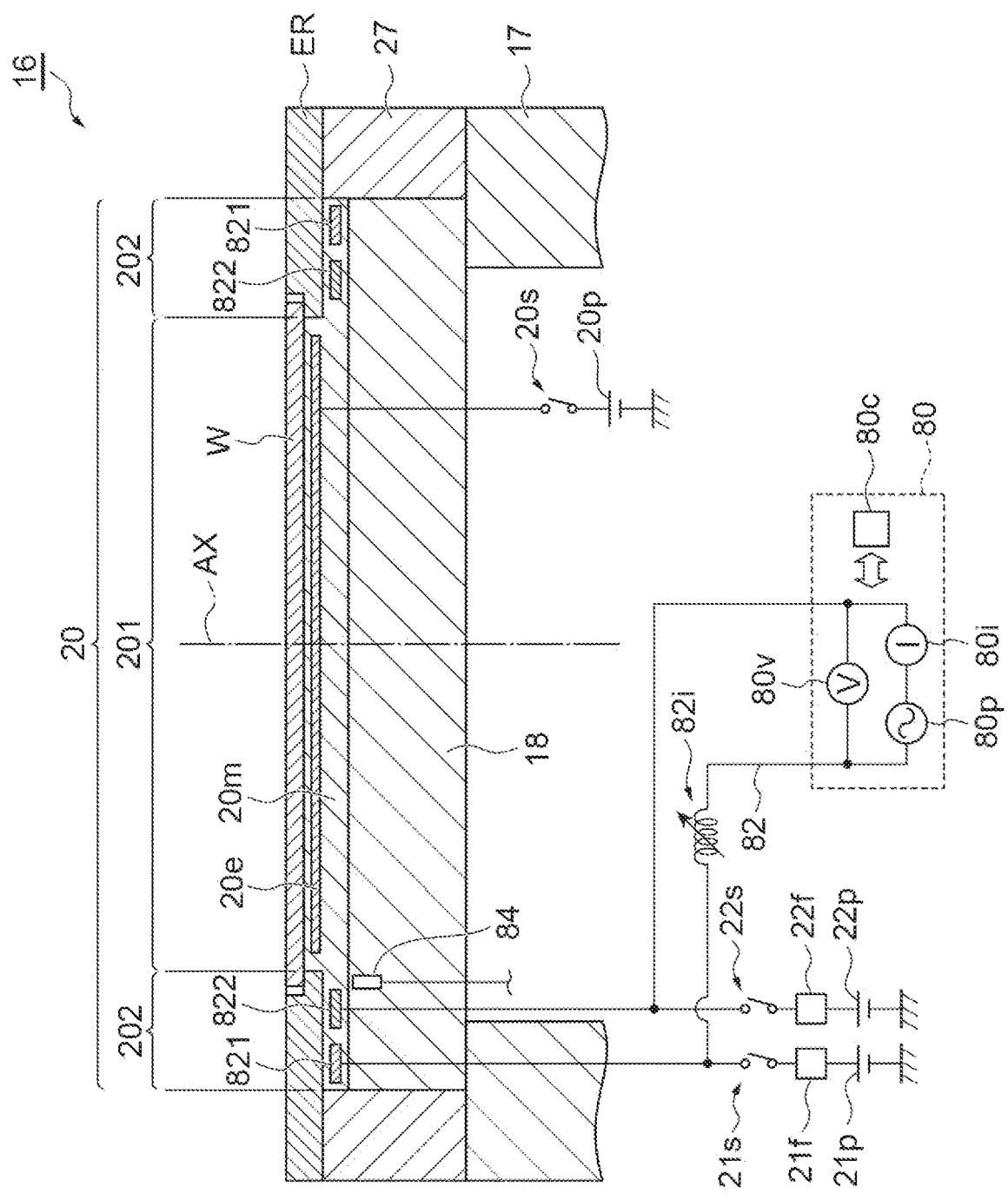
FIG. 6 is a diagram of a substrate support according to another exemplary embodiment.

FIG. 6 is a diagram of a substrate support according to another exemplary embodiment. The plasma processing apparatus 1 may include a substrate support 16 shown in FIG. 6. In the substrate support 16 shown in FIG. 6, a first electrode 821 and a second electrode 822 are in the same layout as the first electrode 821 and the second electrode 822 in the substrate support 16 shown in FIGS. 4 and 5. In the substrate support 16 shown in FIG. 6, the second portion 202 serves as an ESC holding the edge ring ER. More specifically, the first electrode 821 and the second electrode 822 in the substrate support 16 shown in FIG. 6 serve as a bipolar electrode in the ESC. In other words, the two electrodes (821 and 822) used to generate an electrostatic attraction between the second portion 202 and the edge ring ER are also used to apply a voltage to the edge ring ER to determine the electrical characteristic value of the edge ring ER.

In the substrate support 16 shown in FIG. 6, the first electrode 821 is electrically coupled to a DC power supply 21p. A filter 21f and a switch 21s may be coupled between the first electrode 821 and the DC power supply 21p. The filter 21f is a low-pass filter. The second electrode 822 is electrically coupled to a DC power supply 22p. A filter 22f and a switch 22s may be coupled between the second electrode 822 and the DC power supply 22p. The filter 22f is a low-pass filter.

The DC power supply 21p applies a DC voltage to the first electrode 821 and the DC power supply 22p applies a DC voltage to the second electrode 822 to cause a difference in potential between the first and second electrodes 821 and 822. This generates an electrostatic attraction between the second portion 202 and the edge ring ER. The second portion 202 attracts the edge ring ER under the generated electrostatic attraction and holds the edge ring ER. A single DC power supply may set the potential for the first electrode 821 and the potential for the second electrode 822. The second portion 202 may serve as a monopolar ESC. More specifically, the first electrode 821 and the second electrode 822 may receive the same voltage from one or more DC power supplies.

Figure 7:
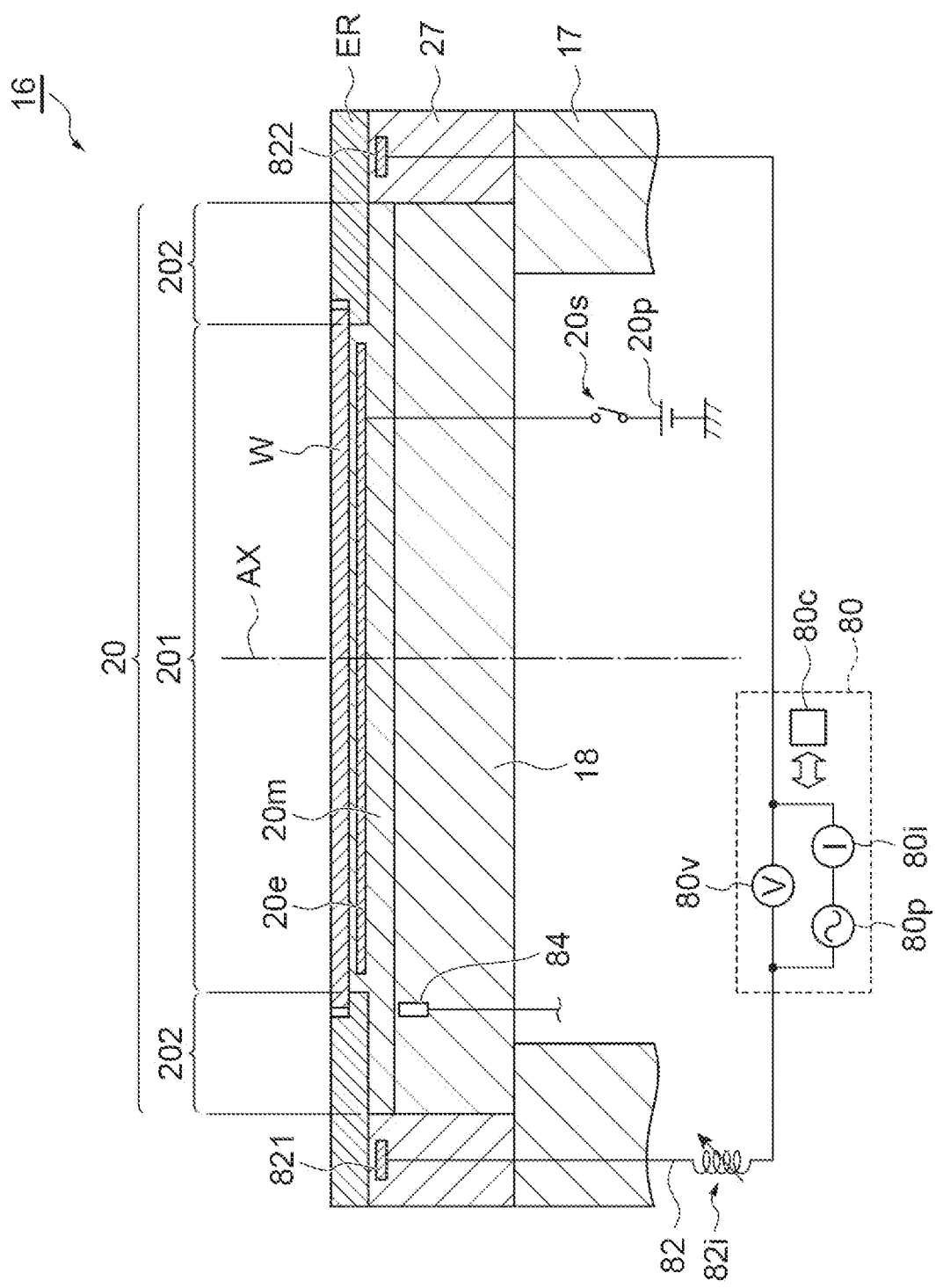
FIG. 7 is a diagram of an electric path including a first electrode and a second electrode according to still another embodiment.
Figure 8:
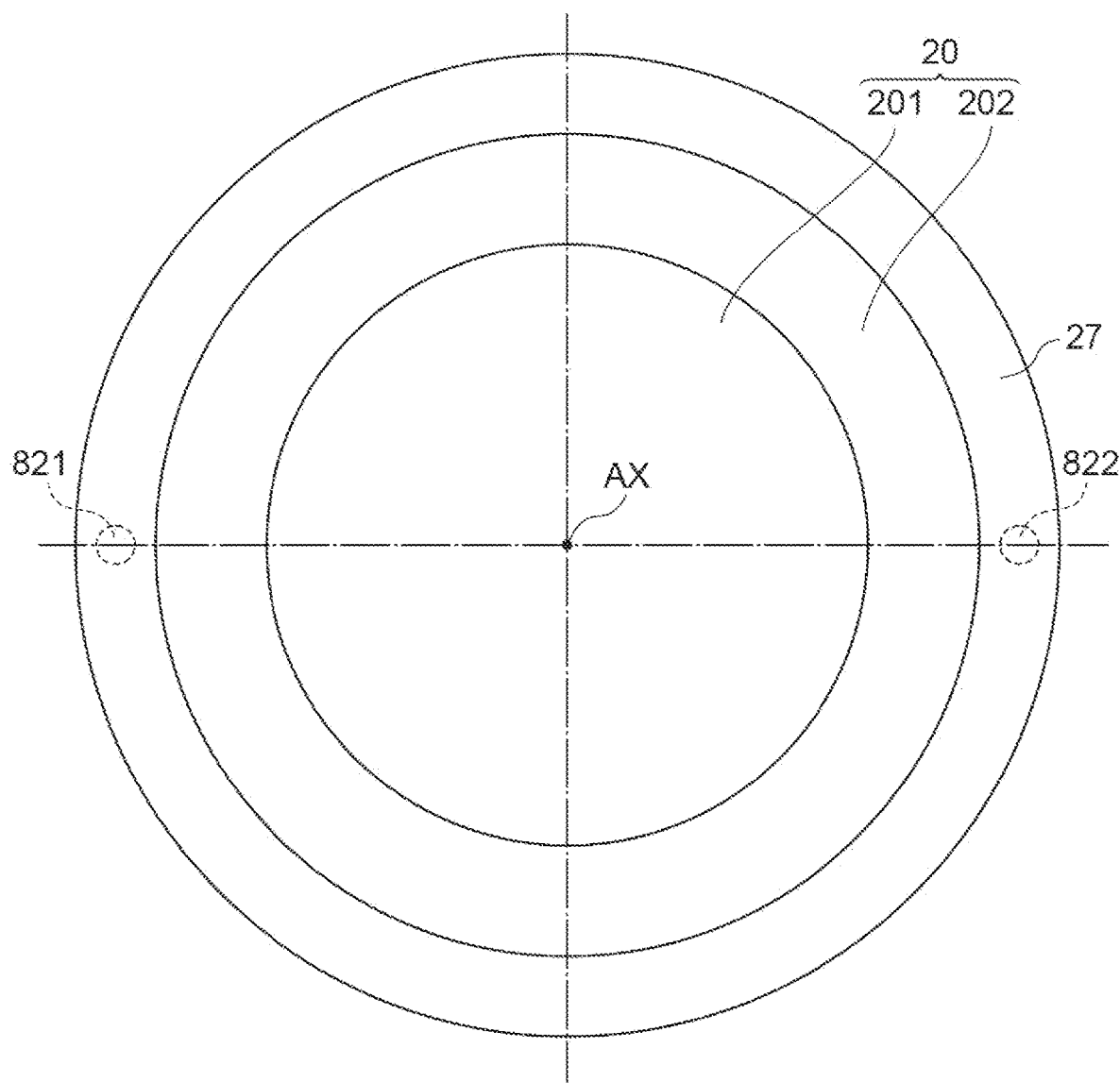
FIG. 8 is a plan view of the first electrode and the second electrode in still another exemplary layout.

FIG. 7 is a diagram of an electric path including a first electrode and a second electrode according to still another embodiment. FIG. 8 is a plan view of the first electrode and the second electrode in still another exemplary layout. The plasma processing apparatus 1 may include an electric path 82 including a first electrode 821 and a second electrode 822 shown in FIGS. 7 and 8. As shown in FIGS. 7 and 8, the first electrode 821 and the second electrode 822 are located in the insulating portion 27. A part of the edge ring ER is placed on the insulating portion 27 and above the first electrode 821 and the second electrode 822. The first electrode 821 and the second electrode 822 shown in FIGS. 7 and 8 may be symmetric to each other about the axis AX in the same manner as the first electrode 821 and the second electrode 822 shown in FIG. 3. In some embodiments, the first electrode 821 and the second electrode 822 may be located in the insulating portion 27, and substantially annular to extend circumferentially about the axis AX in the same manner as the first electrode 821 and the second electrode 822 shown in FIGS. 4 to 6.

Figure 9:
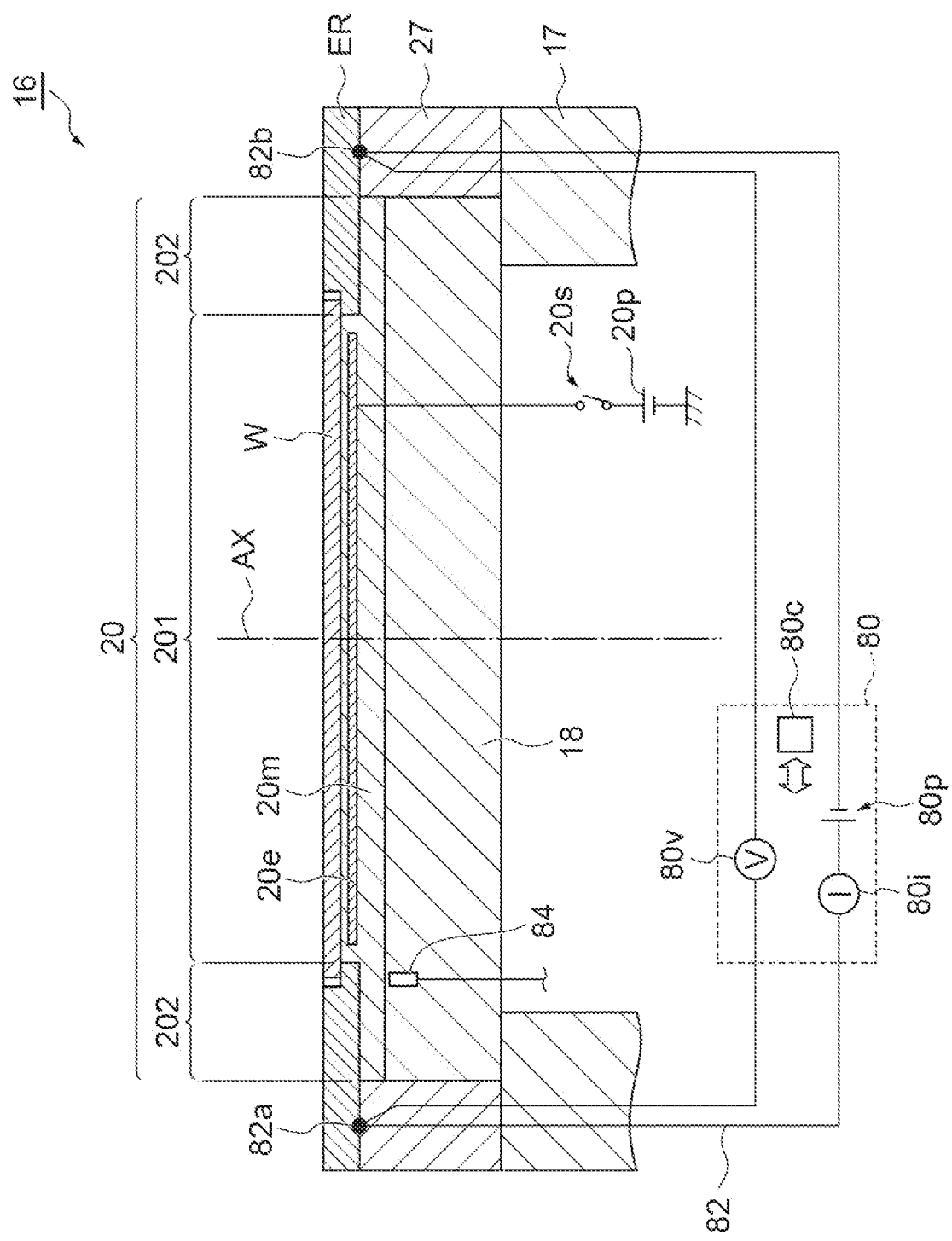
FIG. 9 is a diagram of a substrate support, an electric path, and a measuring device according to still another exemplary embodiment.
Figure 10:
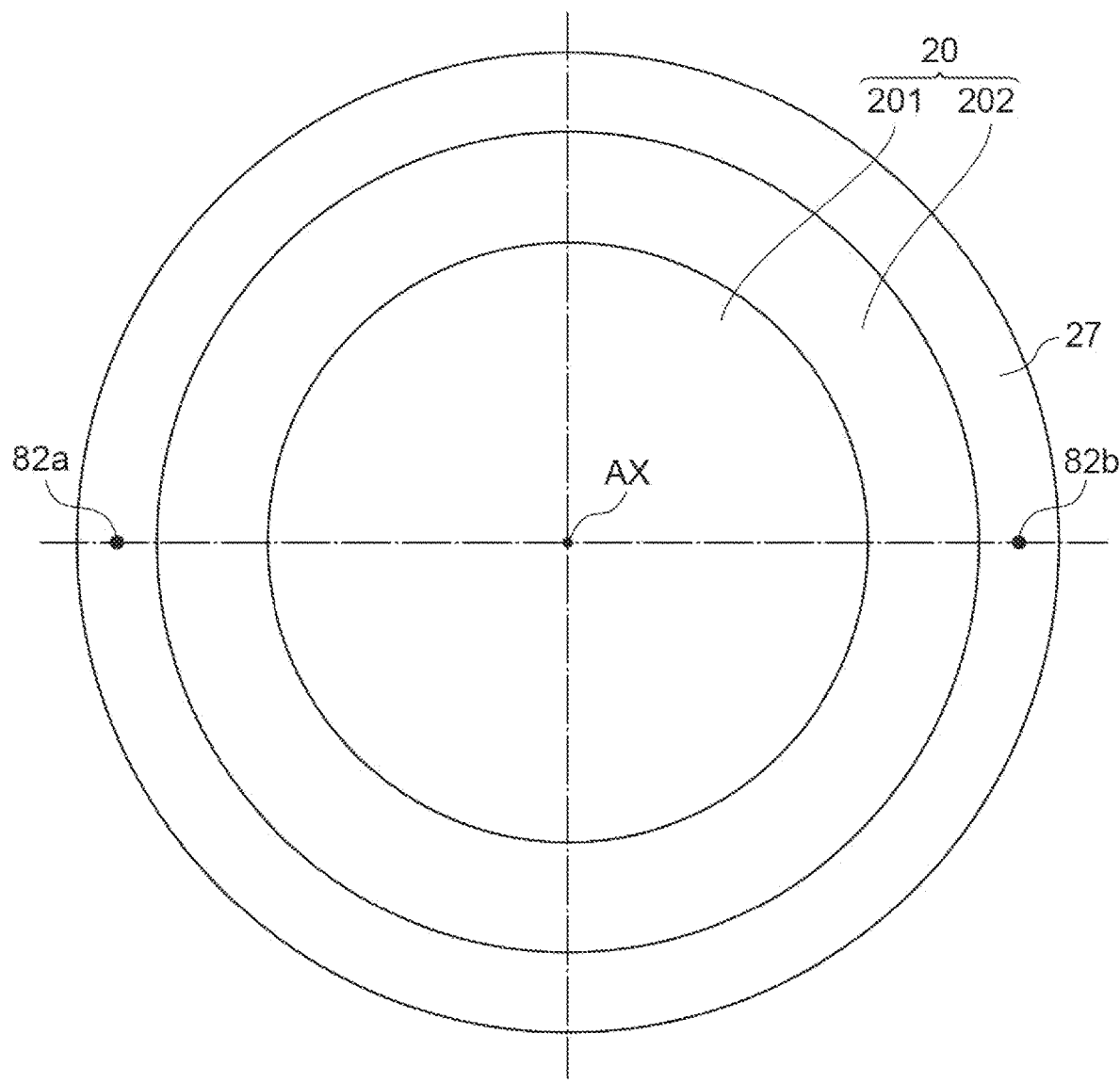
FIG. 10 is a plan view of a first contact and a second contact in an exemplary layout.

FIG. 9 is a diagram of a substrate support, an electric path, and a measuring device according to still another exemplary embodiment. FIG. 10 is a plan view of a first contact and a second contact in an exemplary layout. The plasma processing apparatus 1 may include a substrate support 16, an electric path 82, and a measuring device 80 shown in FIGS. 9 and 10. In this case, the plasma processing apparatus 1 uses an electrical characteristic value of an edge ring ER determined by the measuring device 80 shown in FIG. 9 as well. The plasma processing apparatus 1 including the substrate support 16, the electric path 82, and the measuring device 80 shown in FIGS. 9 and 10 will now be described focusing on its differences from the plasma processing apparatuses 1 according to the embodiments described above.

The measuring device 80 shown in FIG. 9 applies a voltage to the edge ring ER through the electric path 82 coupled to the edge ring ER to measure the electrical characteristic value of the edge ring ER.

As shown in FIGS. 9 and 10, the electric path 82 includes a first contact 82a and a second contact 82b. The first contact 82a and the second contact 82b are in contact with the edge ring ER. In one embodiment, the first contact 82a and the second contact 82b may be in contact with the edge ring ER at positions symmetric to each other about the central axis of the edge ring ER as shown in FIG. 10. In other words, the first contact 82a and the second contact 82b are symmetric to each other about the axis AX. The first contact 82a and the second contact 82b may be located on the insulating portion 27 or the second portion 202.

As shown in FIG. 9, the measuring device 80 may include a power supply 80p, a voltage sensor 80v, and a current sensor 80i. The power supply 80p may be a DC power supply. More specifically, the power supply 80p applies a DC voltage to the edge ring ER through the electric path 82. The current sensor 80i is located on the electric path 82 and coupled to the power supply 80p in series. The current sensor 80i measures a current value of the current flowing through the edge ring ER in accordance with the voltage applied from the power supply 80p through the electric path 82. The voltage sensor 80v measures a potential difference across the edge ring ER in accordance with the voltage applied from the power supply 80p. The potential difference is a difference in potential between the first contact 82a and the second contact 82b.

The measuring device 80 shown in FIG. 9 may further include an arithmetic unit 80c. The arithmetic unit 80c may include a processor and a memory. In the measuring device 80 shown in FIG. 9, the arithmetic unit 80c determines the resistance of the edge ring ER as the electrical characteristic value of the edge ring ER. More specifically, the arithmetic unit 80c can determine the resistance of the edge ring ER based on a voltage V (potential difference) measured by the voltage sensor 80v and a current I measured by the current sensor 80i with the formula V/I. The controller MC may calculate the resistance of the edge ring ER in place of the arithmetic unit 80c. In this case, the measuring device 80 includes the controller MC and may eliminate the arithmetic unit 80c. The voltage sensor 80v may measure a potential difference between a contact adjacent to the first contact 82a and a contact adjacent to the second contact 82b. In other words, the measuring device 80 may determine the resistance of the edge ring ER by a four-terminal method. The four-terminal method can measure the resistance of the edge ring ER with a reduced likelihood of being affected by the resistance of the electric path 82 and the resistance of the wiring that interconnects the voltage sensor 80v and the edge ring ER.

Figure 11:
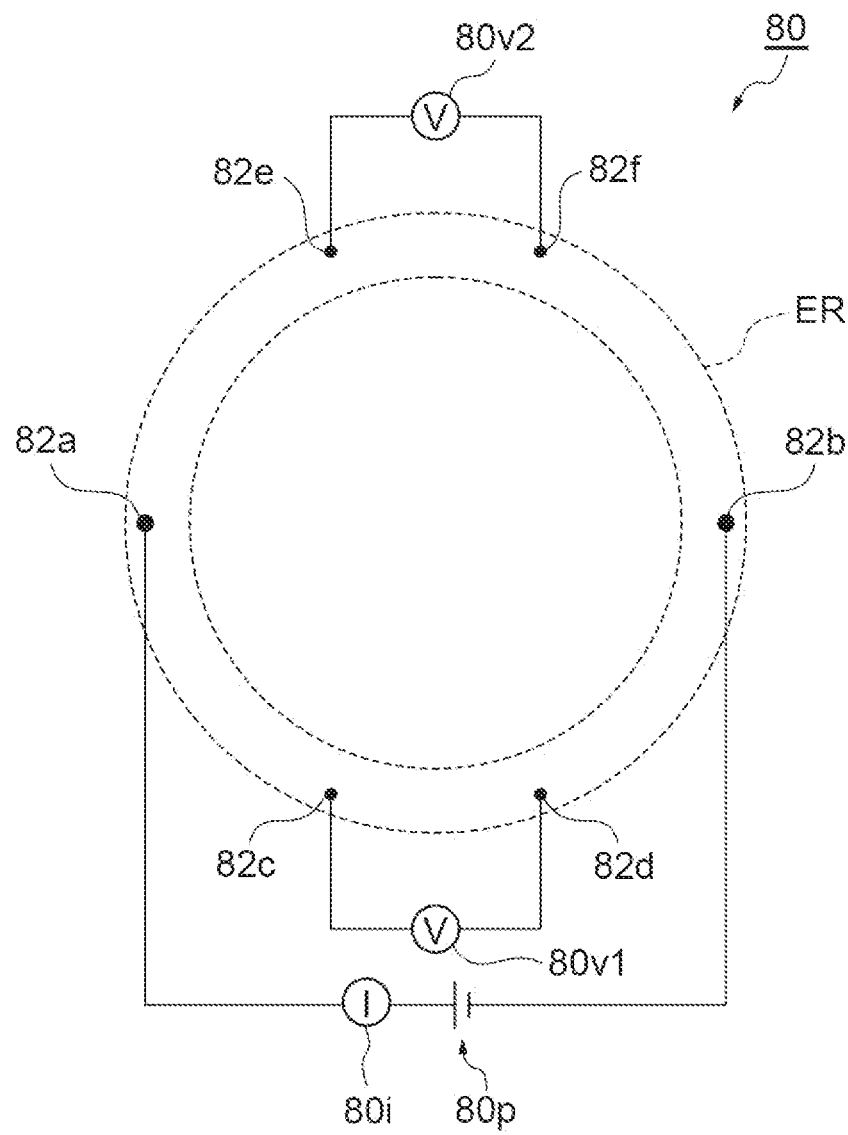
FIG. 11 is a diagram of a measuring device according to still another exemplary embodiment.
Figure 12:
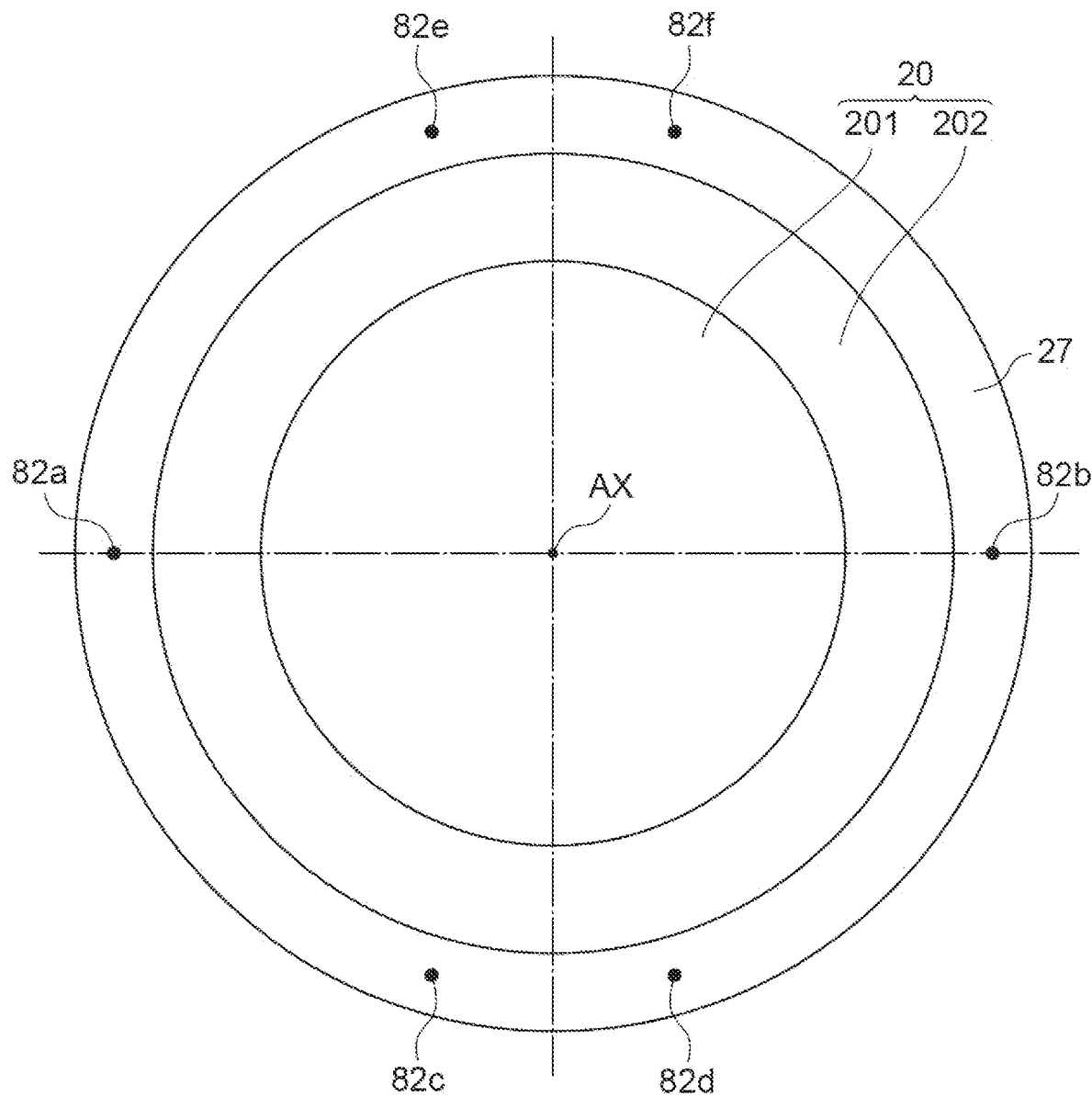
FIG. 12 is a diagram of the measuring device according to the other exemplary embodiment including contacts between the edge ring and electric paths extending from two voltage sensors in the measuring device in an exemplary layout.

FIG. 11 is a diagram of a measuring device according to still another exemplary embodiment. FIG. 12 is a diagram of the measuring device according to the other exemplary embodiment including contacts between an edge ring and electric paths extending from two voltage sensors in the measuring device in an exemplary layout. The plasma processing apparatus 1 may include the measuring device and the electric path shown in FIGS. 11 and 12. The plasma processing apparatus 1 including the measuring device and the electric path shown in FIG. 11 will now be described focusing on its differences from the plasma processing apparatus 1 including the measuring device and the electric path shown in FIG. 9.

The measuring device 80 shown in FIG. 11 includes a first voltage sensor 80v1 and a second voltage sensor 80v2 in place of the voltage sensor 80v. The measuring device 80 may measure the resistance of the edge ring ER with the first voltage sensor 80v1 and the second voltage sensor 80v2 by the four-terminal method.

The first voltage sensor 80v1 measures a first potential difference across a first area of the edge ring ER. The first area extends in a first part of the plane including the first contact 82a, the second contact 82b, and the central axis (axis AX) of the edge ring ER. The second voltage sensor 80v2 measures a second potential difference across a second area of the edge ring ER extending in a second part of the plane.

The potential difference across the first area is a difference in potential between the contacts 82c and 82d. The contacts 82c and 82d are included in the electric path extending from the first voltage sensor 80v1 to the edge ring ER. The contacts 82c and 82d are in contact with the edge ring ER. The contacts 82c and 82d may be on the insulating portion 27 or the second portion 202.

The potential difference across the second area is a difference in potential between the contacts 82e and 82f. The contacts 82e and 82f are included in the electric path extending from the second voltage sensor 80v2 to the edge ring ER. The contacts 82e and 82f are in contact with the edge ring ER. The contacts 82e and 82f may be on the insulating portion 27 or the second portion 202. The contacts 82c and 82f may be symmetric to each other about the central axis (axis AX) of the edge ring ER. The contacts 82d and 82e may also be symmetric to each other about the central axis (axis AX) of the edge ring ER.

The contacts 82c and 82d may be symmetric to each other across a plane including the central axis (axis AX) of the edge ring ER and orthogonal to a straight line connecting the first contact 82a and the second contact 82b. The contacts 82e and 82f may also be symmetric to each other across the plane including the central axis (axis AX) of the edge ring ER and orthogonal to the straight line connecting the first contact 82a and the second contact 82b.

The arithmetic unit 80c or the controller MC in the measuring device 80 determines the resistance of the edge ring ER based on the average of the first potential difference and the second potential difference and on a current value measured by the current sensor 80i. The arithmetic unit 80c or the controller MC in the measuring device 80 may determine a first resistivity of the edge ring ER based on the first potential difference, a distance (circumferential distance) between the contacts 82c and 82d, and a current value measured by the current sensor 80i. The arithmetic unit 80c or the controller MC in the measuring device 80 may determine a second resistivity of the edge ring ER based on the second potential difference, a distance (circumferential distance) between the contacts 82e and 82f and a current value measured by the current sensor 80i. The arithmetic unit 80c or the controller MC in the measuring device 80 may determine the average of the first resistivity and the second resistivity as the electrical characteristic value of the edge ring ER. In this case, the contacts 82c and 82f may be asymmetric to each other about the central axis (axis AX) of the edge ring ER. The contacts 82d and 82e may also be asymmetric to each other about the central axis (axis AX) of the edge ring ER.

Figure 13:
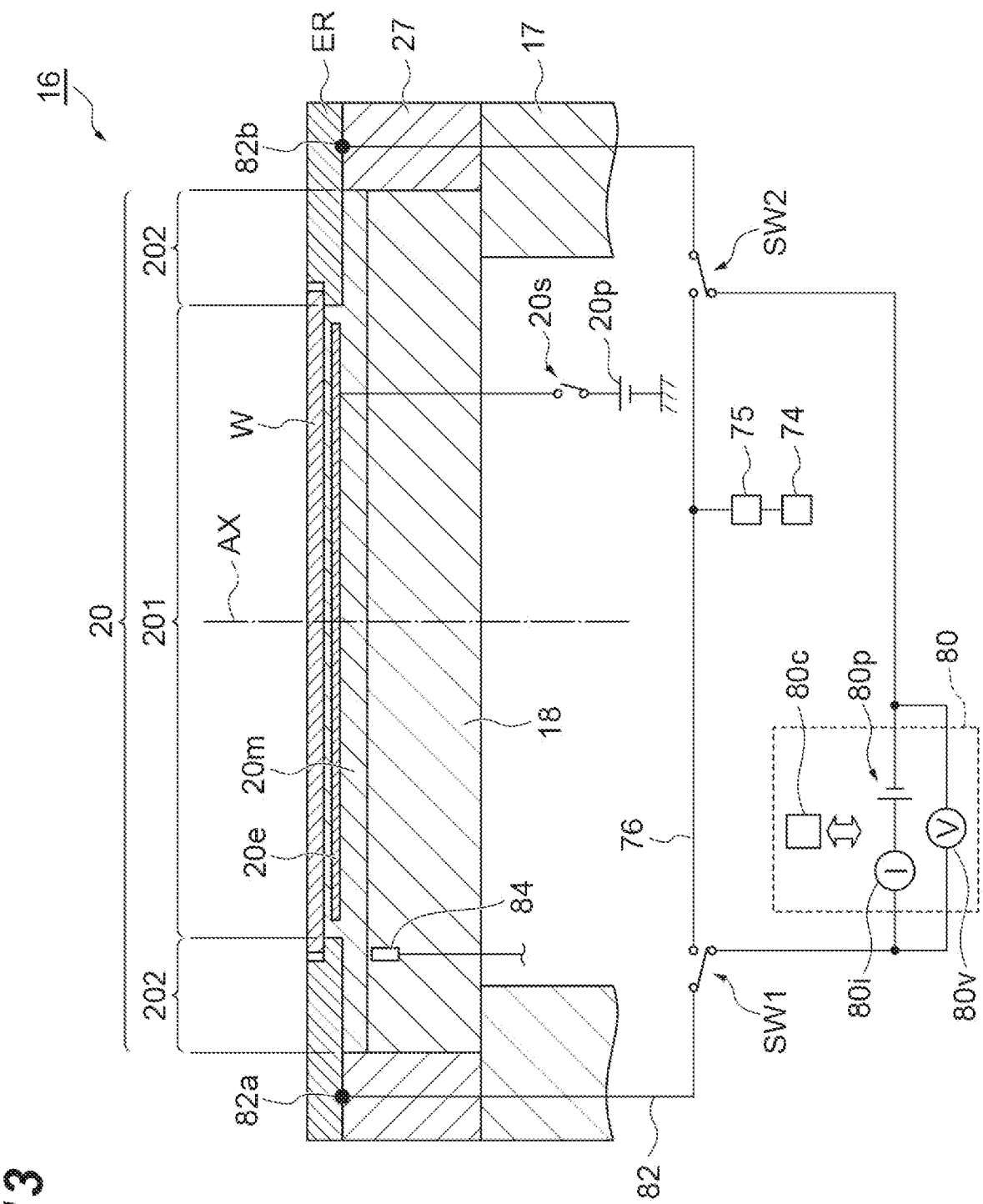
FIG. 13 is a diagram of an electric path according to still another exemplary embodiment.
Figure 14:
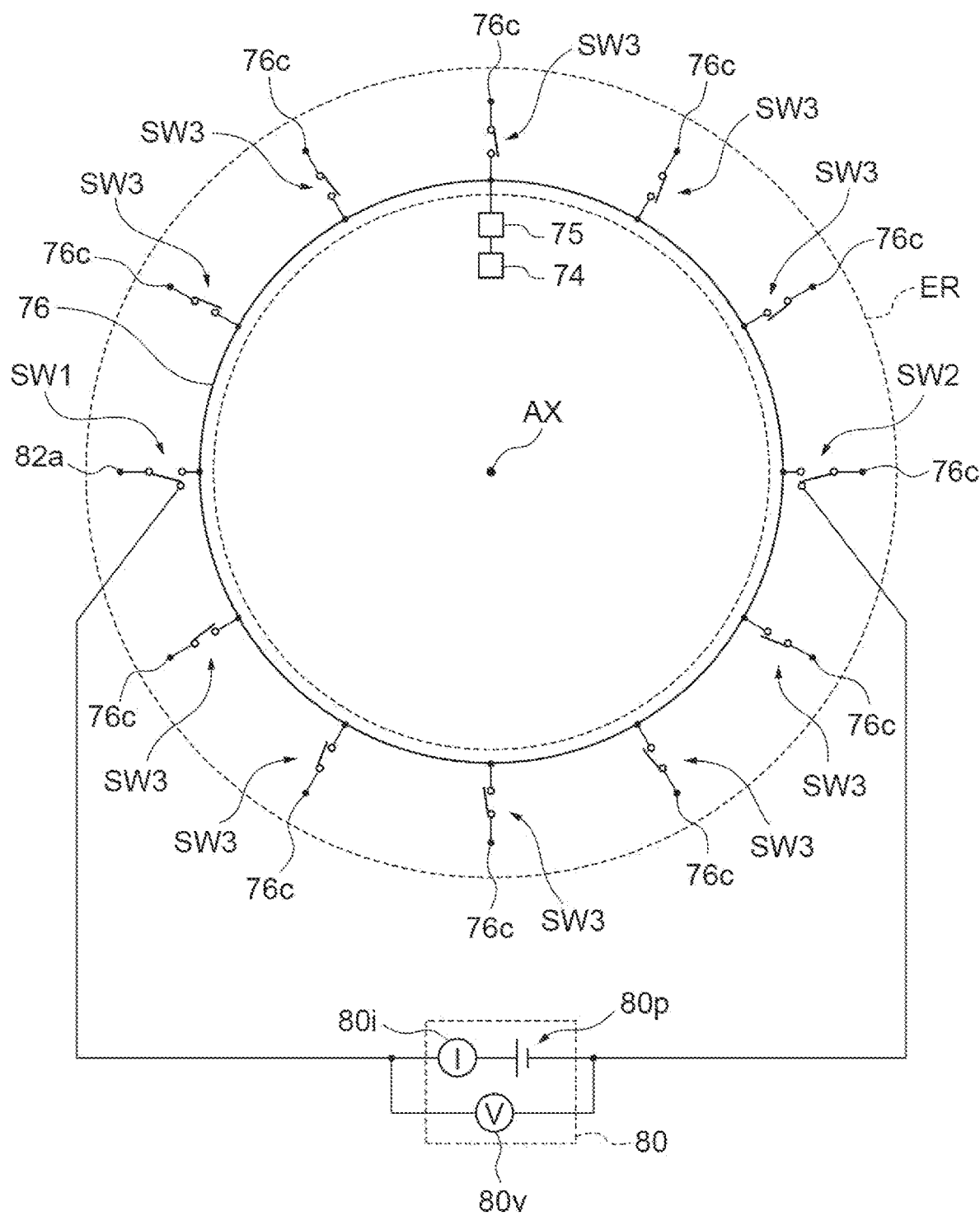
FIG. 14 is a plan view of the electric path according to the other exemplary embodiment.

FIG. 13 is a diagram of an electric path according to still another exemplary embodiment. FIG. 14 is a plan view of the electric path according to the other exemplary embodiment. The plasma processing apparatus 1 may include the electric path shown in FIGS. 13 and 14. The plasma processing apparatus 1 including the electric path shown in FIGS. 13 and 14 will now be described focusing on its differences from the plasma processing apparatus 1 including the electric path shown in FIG. 9.

The electric path 82 shown in FIGS. 13 and 14 includes a first switch SW1 and a second switch SW2. The first switch SW1 includes a first terminal, a second terminal, and a third terminal. The first switch SW1 selectively couples the first terminal to the second terminal or to the third terminal. The controller MC may control the first switch SW1. The first terminal of the first switch SW1 is coupled to a first contact 82a. The second terminal of the first switch SW1 is coupled to a power supply 80p. The third terminal of the first switch SW1 is coupled to a conducting wire 76.

The second switch SW2 includes a first terminal, a second terminal, and a third terminal. The second switch SW2 selectively couples the first terminal to the second terminal or to the third terminal. The controller MC may control the second switch SW2. The first terminal of the second switch SW2 is coupled to a second contact 82b. The second terminal of the second switch SW2 is coupled to the power supply 80p. The third terminal of the second switch SW2 is coupled to the conducting wire 76.

As shown in FIG. 14, the conducting wire 76 may be partially annular. More specifically, the conducting wire 76 may include an annular wiring extending circumferentially about the axis AX. The conducting wire 76 may further include one or more switches SW3 and one or more contacts 76c. Each contact 76c is a contact of the conducting wire 76 with the edge ring ER. Each switch SW3 is coupled between the annular wiring and the corresponding contact 76c. When each switch SW3 is turned on, the annular wiring and the corresponding contact 76c are coupled to each other. When each switch SW3 is turned off, the annular wiring and the corresponding contact 76c are uncoupled from each other. The controller MC may control the switches SW3.

The first switch SW1, the second switch SW2, and the switches SW3 may be at circumferentially equal intervals about the axis AX. The first contact 82a, the second contact 82b, and the contacts 76c may also be at circumferentially equal intervals about the axis AX. The annular wiring and wires each extending from the first switch SW1, the second switch SW2, and the switches SW3 may have nodes between them at circumferentially equal intervals about the axis AX.

As shown in FIGS. 13 and 14, the adjuster 74 can apply a voltage to the edge ring ER through the first contact 82a and the second contact 82b on the electric path 82, which may couple the measuring device 80 to the edge ring ER.

Figure 15:
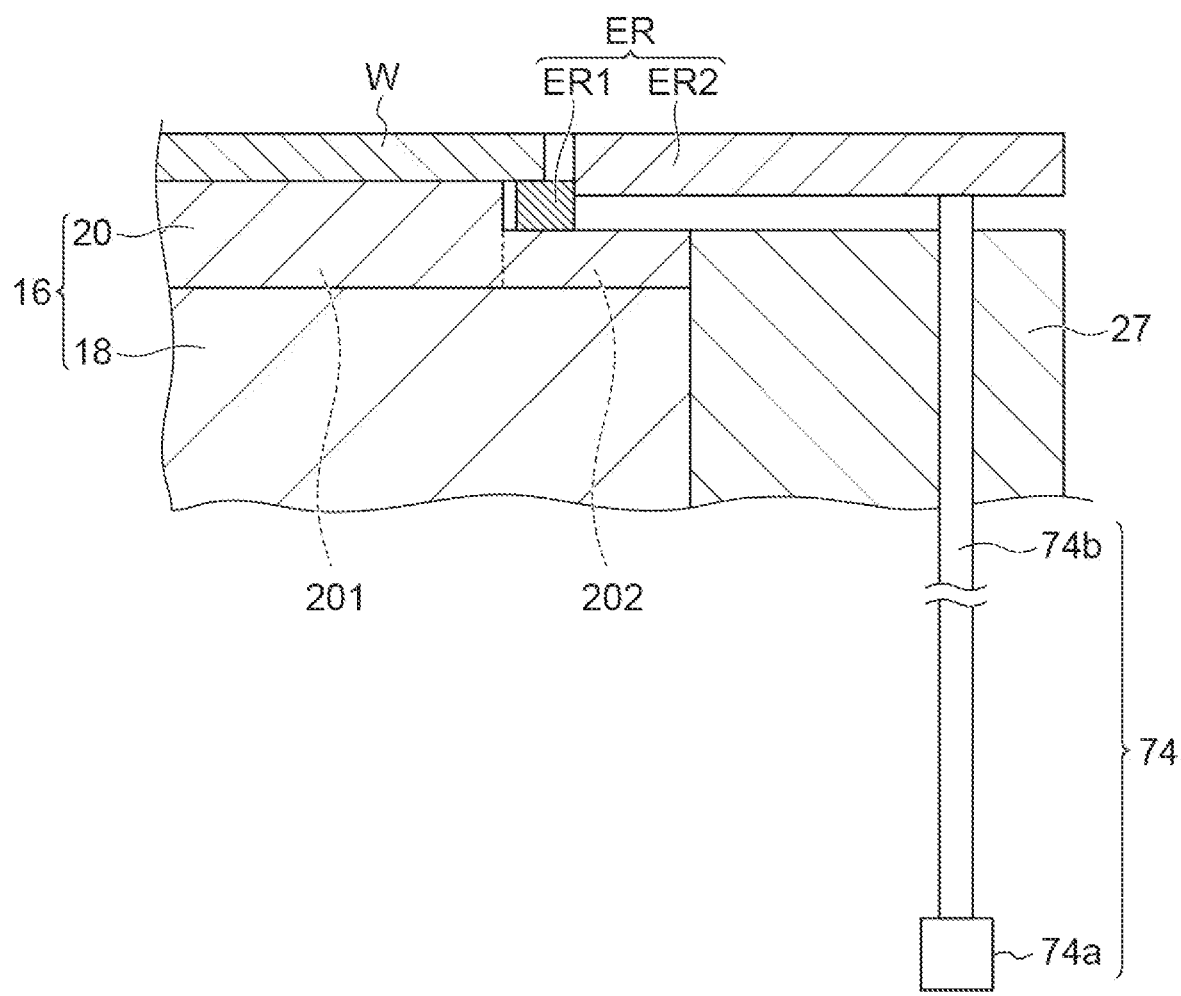
FIG. 15 is a diagram of an adjuster and an edge ring according to still another exemplary embodiment.

FIG. 15 is a diagram of an adjuster and an edge ring according to still another exemplary embodiment. The plasma processing apparatus 1 may include an adjuster 74 shown in FIG. 15, in place of the adjuster 74 in the embodiments described above. The adjuster 74 shown in FIG. 15 may be used with an edge ring ER shown in FIG. 15.

The edge ring ER shown in FIG. 15 includes a first annular member ER1 and a second annular member ER2. The first annular member ER1 and the second annular member ER2 are separate from each other. The first annular member ER1 is an annular plate and on the second portion 202 to extend about the axis AX. A substrate W is placed onto the first portion 201 with the edge on or above the first annular member ER1. The second annular member ER2 is an annular plate and on the second portion 202 to extend about the axis AX. The second annular member ER2 is located outside the first annular member ER1 in the radial direction. The second annular member ER2 may have an internal surface facing the peripheral surface of the edge of the substrate W.

The adjuster 74 shown in FIG. 15 is a moving device for moving the edge ring ER upward to adjust the vertical position of the upper surface of the edge ring ER. More specifically, the adjuster 74 moves the second annular member ER2 upward to adjust the vertical position of the upper surface of the second annular member ER2. In one example, the adjuster 74 includes a drive 74a and a shaft 74b. The shaft 74b supports the second annular member ER2 and extends downward from the second annular member ER2. The drive 74a generates a driving force to move the second annular member ER2 in the vertical direction with the shaft 74b.

The controller MC may control the adjuster 74 shown in FIG. 15. More specifically, the controller MC controls the adjuster 74 to reduce tilting of recesses in the edge of the substrate W on the substrate support 16. The controller MC controls the adjuster 74 in accordance with the electrical characteristic value of the edge ring ER, the thickness of the edge ring ER, or the decrease in the thickness of the edge ring ER. For example, the controller MC determines the vertical position of the upper surface of the edge ring ER (second annular member ER2) in accordance with the electrical characteristic value of the edge ring ER, the thickness of the edge ring ER, or the decrease in the thickness of the edge ring ER using a function or a table. The function or table is predefined for determining the vertical position of the upper surface of the edge ring ER (second annular member ER2) corresponding to the electrical characteristic value of the edge ring ER, the thickness of the edge ring ER, or the decrease in the thickness of the edge ring ER. The controller MC controls the adjuster 74 (e.g., drive 74a) to set the upper surface of the edge ring ER (second annular member ER2) to the determined vertical position.

Figure 16:
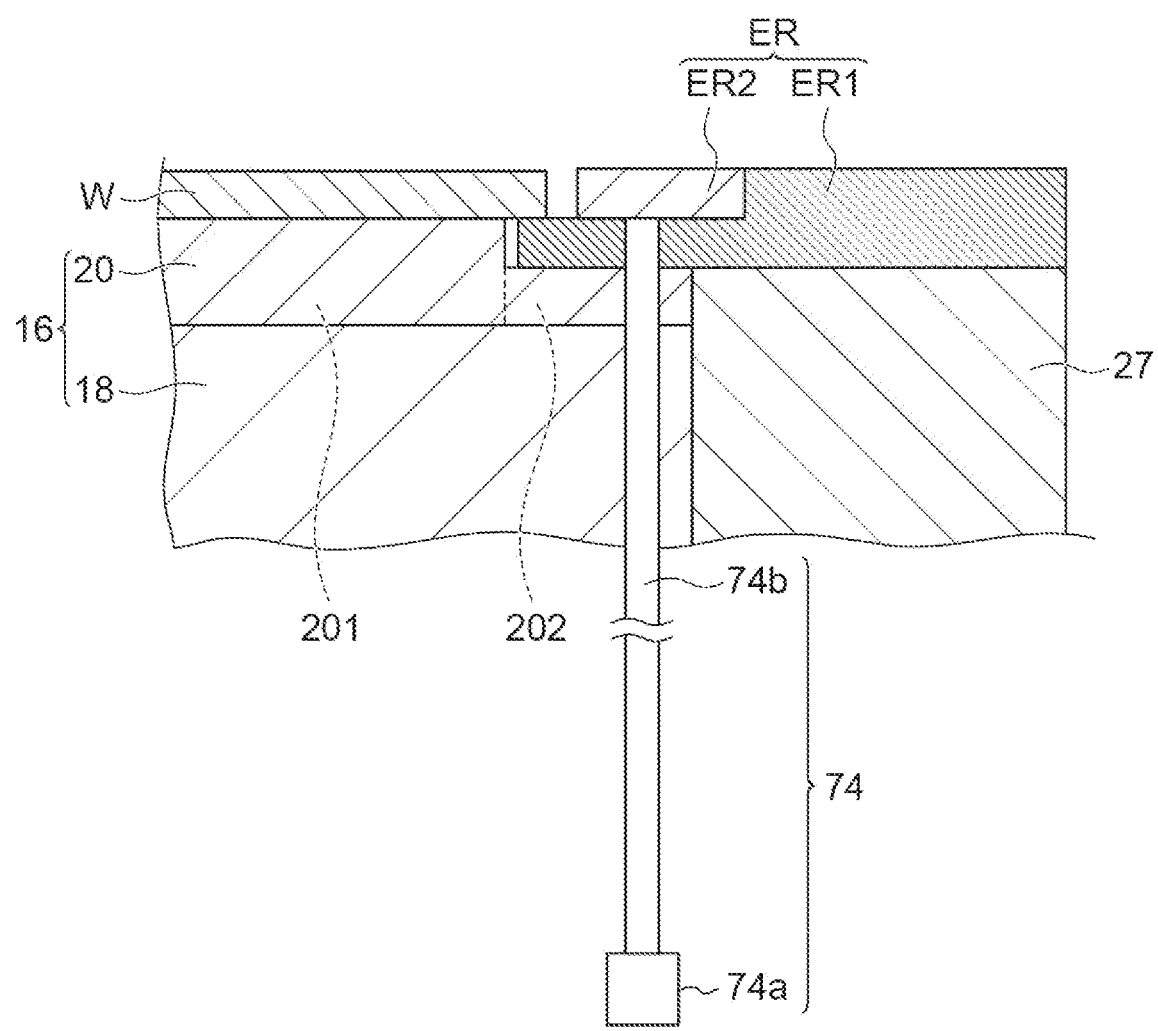
FIG. 16 is a diagram of an adjuster and an edge ring according to still another exemplary embodiment.

FIG. 16 is a diagram of an adjuster and an edge ring according to still another exemplary embodiment. An edge ring ER shown in FIG. 16 is used with the adjuster 74, in place of the edge ring ER shown in FIG. 15. The edge ring ER shown in FIG. 16 includes a first annular member ER1 and a second annular member ER2. In the edge ring ER shown in FIG. 16, the first annular member ER1 includes an inner peripheral portion and an outer peripheral portion. The inner peripheral portion has its upper surface lower than the upper surface of the outer peripheral portion in the vertical direction. A substrate W is placed onto the first portion 201 with the edge on or above the inner peripheral portion of the first annular member ER1. In the edge ring ER shown in FIG. 16, the second annular member ER2 is on the inner peripheral portion of the first annular member ER1 to surround the edge of the substrate W. In other words, the edge ring ER shown in FIG. 16 includes the second annular member ER2 located inside the outer peripheral portion of the first annular member ER1. When the edge ring ER shown in FIG. 16 is used, the shaft 74b in the adjuster 74 extends downward from the second annular member ER2 through the inner peripheral portion of the first annular member ER1. When the edge ring ER shown in FIG. 16 is used, the adjuster 74 sets the vertical position of the second annular member ER2 to be the position of the upper surface of the edge ring ER.

The plasma processing apparatuses according to the above embodiments include the electric path 82 to be coupled to or capacitively coupled to the edge ring ER while the edge ring ER is placed on the substrate support 16. The measuring device 80 applies a voltage to the edge ring ER through the electric path 82 to measure the electrical characteristic value of the edge ring ER that varies depending on the thickness of the edge ring ER. This allows determination of a value reflecting the thickness of the edge ring ER.

Figure 17:
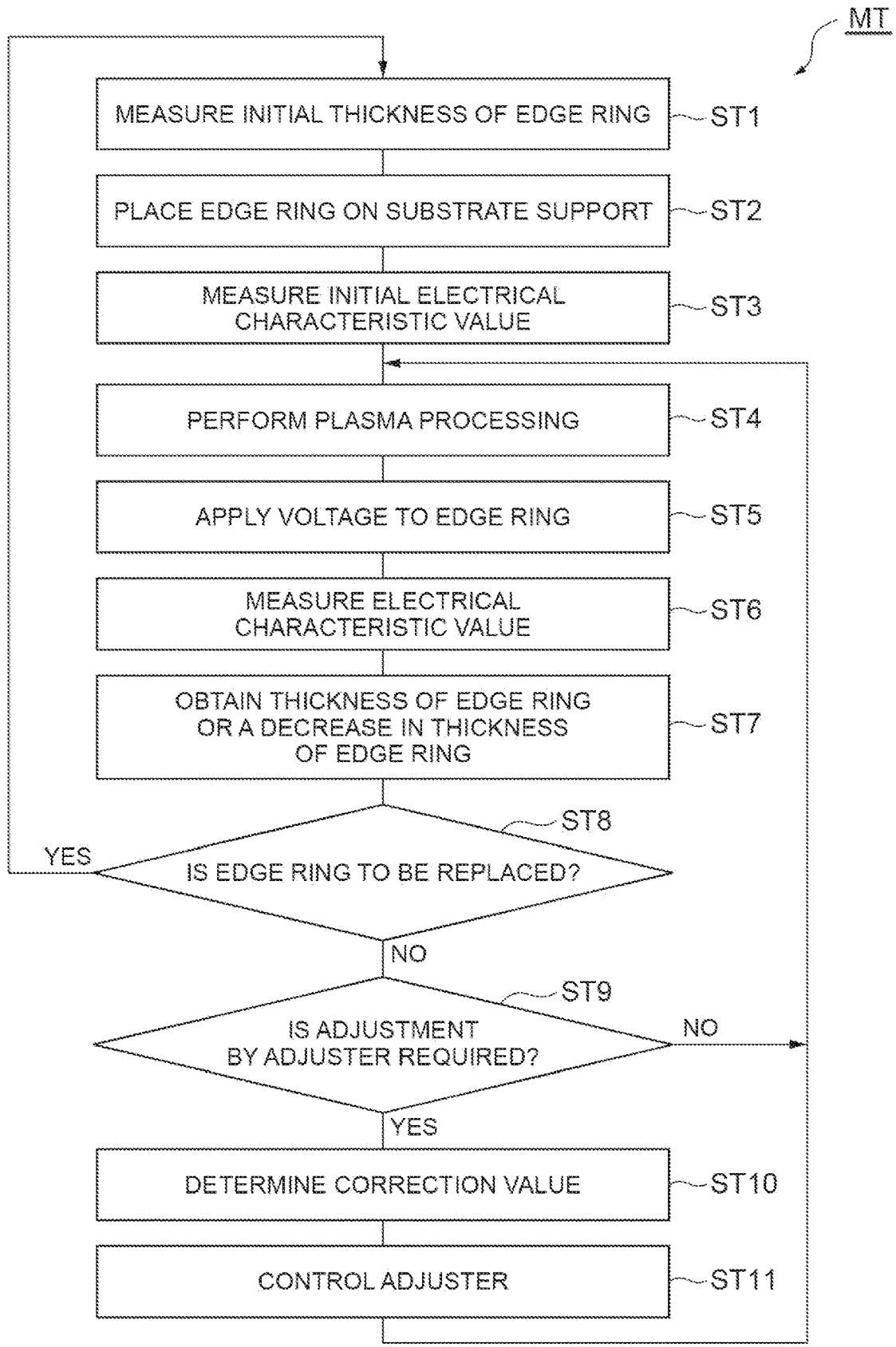
FIG. 17 is a flowchart of a method according to an exemplary embodiment.

FIG. 17 is a flowchart of a method according to an exemplary embodiment. A method MT shown in FIG. 17 can be implemented by the plasma processing apparatus 1 according to any one of the embodiments described above. The method MT includes steps ST5 and ST6. A measurement method according to an exemplary embodiment includes steps ST5 and ST6.

The method MT may include the first step ST1. In step ST1, the initial thickness of the edge ring ER is measured. The initial thickness of the edge ring ER is measured by, but is not limited to, a measuring device such as a caliper or a micrometer.

The method MT may include step ST2 following step ST1. In step ST2, an edge ring ER is placed onto the substrate support 16. The edge ring ER may be transferred into the chamber 10 and placed onto the substrate support 16 by a transfer robot. The controller MC controls the transfer robot.

The method MT may include step ST3 following step ST2. In step ST3, an initial electrical characteristic value of the edge ring ER is measured. The measuring device 80 measures the initial electrical characteristic value of the edge ring ER on the substrate support 16.

The method MT includes the next step ST4. Step ST4 is performed on the edge ring ER on the substrate support 16 and a substrate W in an area on the substrate support 16 surrounded by the edge ring ER. Plasma processing is performed in step ST4. The plasma processing in step ST4 may include plasma etching. In step ST4, plasma is generated from a process gas in the chamber 10. In step ST4, the substrate W is processed (e.g., etched) with a chemical species contained in the generated plasma. In step ST4, the controller MC controls the gas supply unit to supply the process gas into the chamber 10. in step ST4, the controller MC controls the exhaust device 50 to maintain the chamber 10 at a specified gas pressure. In step ST4, the controller MC controls at least one of the RF power supply 61 or the bias power supply 62 to provide at least one of RF power HF or bias power BP.

The method MT includes the next step ST5. For example, step ST5 is performed while no plasma processing in step ST4 is being performed, or in other words, while the plasma processing apparatus 1 is in an idle state. In step ST5, the measuring device 80 applies a voltage to the edge ring ER through the electric path 82. The measuring device 80 applies a DC voltage, an AC voltage, or an RF voltage to the edge ring ER as described above. Step ST6 is performed on the edge ring ER receiving a voltage in step ST5. In step ST6, the measuring device 80 measures the electrical characteristic value of the edge ring ER receiving a voltage. The electrical characteristic value of the edge ring ER on the substrate support 16 is measured.

When the electrical characteristic value of the edge ring ER is highly dependent on temperature, steps ST5 and ST6 may be performed on the edge ring ER with the temperature being controlled at the reference temperature by the temperature controller as described above. In some embodiments, when the electrical characteristic value of the edge ring ER is highly dependent on temperature, the electrical characteristic value of the edge ring ER at a temperature measurement value obtained by the temperature sensor 84 may be converted to an electrical characteristic value of the edge ring ER at the reference temperature. This conversion uses the predetermined function or table as described above.

The method MT may include the next step ST7. In step ST7, the thickness of the edge ring ER or a decrease in the thickness of the edge ring ER is obtained. The thickness of the edge ring ER is determined by converting the electrical characteristic value of the edge ring ER using the predetermined function or table as described above. The decrease in the thickness of the edge ring ER is determined by subtracting the thickness of the edge ring ER determined in step ST7 from the initial thickness of the edge ring ER measured in step ST1 as described above.

In subsequent step ST8, the determination is performed as to whether the edge ring ER is to be replaced. In step ST8, the electrical characteristic value of the edge ring ER measured in step ST6, the thickness of the edge ring ER obtained in step ST7, or the decrease in the thickness of the edge ring ER obtained in step ST7 is compared with a threshold value. When the comparison in step ST8 shows that the edge ring ER has worn and to be replaced, the edge ring ER is replaced and the processing in step ST1 and subsequent steps are repeated. When the comparison in step ST8 shows that the edge ring ER is not to be replaced, step ST9 is performed. The controller MC may perform the determination in step ST8.

In step ST9, the determination is performed as to whether the upper end position of the sheath above the edge ring ER is to be adjusted by the adjuster 74. In step ST9, the electrical characteristic value of the edge ring ER measured in step ST6, the thickness of the edge ring ER obtained in step ST7, or the decrease in the thickness of the edge ring ER obtained in step ST7 is compared with another threshold value. When the comparison in step ST9 shows that the substrate W on the substrate support 16 is expected to form acceptable tilting of recesses at its edge through the plasma processing in step ST4, step ST4 is performed. When the comparison in step ST9 shows that the substrate W on the substrate support 16 is expected to form unacceptable tilting of recesses at its edge through the plasma processing in step ST4, step ST10 is performed. The controller MC may perform the determination in step ST9.

In step ST10, a correction value is determined. The controller MC may determine the correction value. The correction value is a potential set for the edge ring ER by the adjuster 74 in subsequent step ST11 or the vertical position of the upper surface of the edge ring ER set by the adjuster 74 in step ST11. As described above, the correction value is determined in accordance with the electrical characteristic value (e.g., resistance $R_{ER}$) of the edge ring ER, the thickness of the edge ring ER, or the decrease in the thickness of the edge ring ER using the predefined. function or table.

In subsequent step ST11, the controller MC controls the adjuster 74 using the correction value determined in step ST10. For example, the controller MC controls the adjuster 74 to set the potential for the edge ring ER to the potential corresponding to the correction value. In some embodiments, the controller MC controls the adjuster 74 to set the vertical position of the upper surface of the edge ring ER to the vertical position corresponding to the correction value. After step ST11, step ST4 is performed again. Step ST4 is performed with the adjuster 74 controlled in step ST11.

Although the exemplary embodiments have been described above, the embodiments are not restrictive, and various additions, omissions, substitutions, and changes may be made. The components in the different exemplary embodiments may be combined to form another exemplary embodiment.

A plasma processing apparatus according to another embodiment may be an inductively coupled plasma processing apparatus. A plasma processing apparatus according to still another embodiment may be a plasma processing apparatus that generates plasma using surface waves such as microwaves. The first portion 201 and the second portion 202 may be separate ESCs.

A plasma processing apparatus according to another embodiment may include, in place of the adjuster 74, an adjuster for adjusting plasma density above at least one of the edge ring ER or the substrate W. The controller MC may control the adjuster in accordance with the electrical characteristic value of the edge ring ER, the thickness of the edge ring ER, or the decrease in the thickness of the edge ring ER.

The exemplary embodiments according to the present disclosure have been described by way of example, and various changes may be made without departing from the scope and spirit of the present disclosure. The exemplary embodiments disclosed above are thus not restrictive, and the true scope and spirit of the present disclosure is defined by the appended claims.

What is claimed is:
1. A plasma processing apparatus, comprising:
a chamber;
a substrate support accommodated in the chamber;
an electric path coupled to or capacitively coupled to an edge ring on the substrate support;
a measuring device configured to measure an electrical characteristic value of the edge ring with a voltage applied to the edge ring on the substrate support through the electric path, the electrical characteristic value being variable in accordance with a thickness of the edge ring;
an adjuster configured to adjust an upper end position of a sheath above the edge ring; and
a controller configured to control the adjuster to reduce tilting of a recess in an edge of a substrate on the substrate support, the controller being configured to control the adjuster in accordance with the electrical characteristic value, or a thickness of the edge ring determined based on the electrical characteristic value or a decrease in the thickness of the edge ring determined based on the electrical characteristic value.

2. The plasma processing apparatus according to claim 1, further comprising:
a temperature controller configured to control a temperature of the edge ring, wherein the measuring device obtains the electrical characteristic value of the edge ring with the temperature being controlled at a reference temperature by the temperature controller.

3. The plasma processing apparatus according to claim 1, further comprising:
a temperature sensor configured to obtain a temperature measurement value of the edge ring,
wherein the electrical characteristic value includes an electrical characteristic value of the edge ring at a reference temperature, and
the measuring device converts an electrical characteristic value of the edge ring at the temperature measurement value obtained by the temperature sensor to an electrical characteristic value of the edge ring at the reference temperature.

4. The plasma processing apparatus according to claim 1, wherein
the measuring device measures the electrical characteristic value with an alternating-current voltage or a radio-frequency voltage applied to the edge ring through the electric path capacitively coupled to the edge ring.

5. The plasma processing apparatus according to claim 4, wherein
the electrical characteristic value includes a value of a real part of an impedance of the edge ring.

6. The plasma processing apparatus according to claim 4, wherein
the substrate support includes a dielectric portion on which a part of the edge ring is placeable, the electric path includes a first electrode and a second electrode located in the dielectric portion, and the measuring device applies the alternating-current voltage or the radio-frequency voltage to the edge ring through the first electrode and the second electrode capacitively coupled to the edge ring.

7. The plasma processing apparatus according to claim 6, wherein
the substrate support further includes a lower electrode and an electrostatic chuck located on the lower electrode, and the dielectric portion extends between the lower electrode and the electrostatic chuck and a side wall of the chamber to surround the lower electrode and the electrostatic chuck.

8. The plasma processing apparatus according to claim 6, wherein
the substrate support includes an electrostatic chuck, and the dielectric portion includes a part of the electrostatic chuck.

9. The plasma processing apparatus according to claim 8, wherein
the first electrode and the second electrode are electrically coupled to one or more direct-current power supplies to generate an electrostatic attraction between the electrostatic chuck and the edge ring.

10. The plasma processing apparatus according to claim 1, wherein
the measuring device measures the electrical characteristic value with a direct-current voltage applied to the edge ring through the electric path coupled to the edge ring.

11. The plasma processing apparatus according to claim 10, wherein
the electrical characteristic value includes a resistance of the edge ring.

12. The plasma processing apparatus according to claim 11, wherein
the electric path includes a first contact and a second contact in contact with the edge ring at positions symmetric to each other about a central axis of the edge ring.

13. The plasma processing apparatus according to claim 12, wherein
the measuring device includes
a current sensor located on the electric path and configured to measure a current value of a current flowing through the edge ring, and
a voltage sensor configured to measure a potential difference across the edge ring between the first contact and the second contact, and
the measuring device determines the resistance based on the potential difference and the current value.

14. The plasma processing apparatus according to claim 12, wherein
the measuring device includes
a current sensor located on the electric path and configured to measure a current value of a current flowing through the edge ring,
a first voltage sensor configured to measure a first potential difference across a first area of the edge ring, the first area extending in a first part of a plane including the first contact, the second contact, and the central axis, and
a second voltage sensor configured to measure a second potential difference across a second area of the edge ring, the second area extending in a second part of the plane, and
the measuring device determines the resistance based on an average of the first potential difference and the second potential difference and on the current value.

15. The plasma processing apparatus according to claim 1, wherein
the measuring device determines a thickness of the edge ring or a decrease in the thickness of the edge ring based on the electrical characteristic value.

16. The plasma processing apparatus according to claim 1, wherein
the adjuster includes a power supply electrically coupled to the edge ring to set a potential of the edge ring, and
the electric path includes a first switch and a second switch configured to selectively couple the edge ring to the power supply or to the measuring device.

17. The plasma processing apparatus according to claim 1, wherein
the adjuster is controlled by the controller to adjust a vertical position of an upper surface of the edge ring or a potential of the edge ring in accordance with the electrical characteristic value, or the thickness of the edge ring determined based on the electrical characteristic value or the decrease in the thickness of the edge ring determined based on the electrical characteristic value.

18. A plasma processing apparatus, comprising:
a chamber;
a substrate support accommodated in the chamber;
an electric path coupled to or capacitively coupled to an edge ring on the substrate support; and
a measuring device configured to measure an electrical characteristic value of the edge ring with a voltage applied to the edge ring on the substrate support through the electric path, the electrical characteristic value being variable in accordance with a thickness of the edge ring, wherein the measuring device measures the electrical characteristic value with a direct-current voltage applied to the edge ring through the electric path coupled to the edge ring, the electrical characteristic value includes a resistance of the edge ring, the electric path includes a first contact and a second contact in contact with the edge ring at positions symmetric to each other about a central axis of the edge ring, the measuring device includes a current sensor located on the electric path and configured to measure a current value of a current flowing through the edge ring, a first voltage sensor configured to measure a first potential difference across a first area of the edge ring, the first area extending in a first part of a plane including the first contact, the second contact, and the central axis, and a second voltage sensor configured to measure a second potential difference across a second area of the edge ring, the second area extending in a second part of the plane, and the measuring device determines the resistance based on an average of the first potential difference and the second potential difference and on the current value.

19. A plasma processing apparatus, comprising:

a chamber;

a substrate support accommodated in the chamber;

an electric path coupled to or capacitively coupled to an edge ring on the substrate support; and a measuring device configured to measure an electrical characteristic value of the edge ring with a voltage applied to the edge ring on the substrate support through the electric path, the electrical characteristic value being variable in accordance with a thickness of the edge ring, wherein the measuring device determines a thickness of the edge ring or a decrease in the thickness of the edge ring based on the electrical characteristic value.

* * * * *